United States Patent
Kwon et al.

(10) Patent No.: US 12,174,674 B2
(45) Date of Patent: Dec. 24, 2024

(54) FOLDABLE ELECTRONIC DEVICE AND METHOD FOR CONTROLLING FOLDABLE ELECTRONIC DEVICE

(71) Applicant: SAMSUNG ELECTRONICS CO., LTD., Suwon-si (KR)

(72) Inventors: Oheon Kwon, Suwon-si (KR); Kihun Eom, Suwon-si (KR); Seongsig Kang, Suwon-si (KR); Sejeong Oh, Suwon-si (KR); Heejun Choi, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 225 days.

(21) Appl. No.: 17/983,091

(22) Filed: Nov. 8, 2022

(65) Prior Publication Data

US 2023/0068763 A1 Mar. 2, 2023

Related U.S. Application Data

(63) Continuation of application No. PCT/KR2022/012433, filed on Aug. 19, 2022.

(30) Foreign Application Priority Data

Aug. 19, 2021 (KR) .......................... 10-2021-0109484

(51) Int. Cl.
*G06F 1/16* (2006.01)
*G01R 33/07* (2006.01)
(Continued)

(52) U.S. Cl.
CPC ......... *G06F 1/1677* (2013.01); *G01R 33/072* (2013.01); *G06F 1/1616* (2013.01);
(Continued)

(58) Field of Classification Search
CPC .... G06F 1/1677; G06F 1/1616; G06F 1/1652; G06F 1/1681; G01R 33/072; H04M 1/0214
See application file for complete search history.

(56) References Cited

U.S. PATENT DOCUMENTS

| | | |
|---|---|---|
| 8,659,574 B2 | 2/2014 | Cho et al. |
| 2004/0203534 A1 | 10/2004 | Lim |

(Continued)

FOREIGN PATENT DOCUMENTS

| | | |
|---|---|---|
| CN | 110360922 A | 10/2019 |
| CN | 110849257 B | 2/2020 |

(Continued)

OTHER PUBLICATIONS

International Search Report with English Translation and Written Opinion for International Application No. PCT/KR2022/012433; International Filing Date Aug. 19, 2022; Date of Mailing, Nov. 18, 2022; 8 pages.

*Primary Examiner* — Sagar Shrestha
(74) *Attorney, Agent, or Firm* — CANTOR COLBURN LLP

(57) ABSTRACT

A method is provided for folding an electronic device including a first housing and a second housing. The method includes an operation of calculating an angle between the first housing and the second housing. The operation of calculating the angle includes calculating, based on sensing data measured by a first sensor module disposed in the first housing and a second sensor module disposed in the second housing, an angle between the first housing and the second housing. The method further includes an operation of measuring a magnetic force value using a digital Hall sensor when a state of the foldable electronic device corresponding to the calculated angle corresponds to a set condition. The method further includes an operation of setting a first (Continued)

reference value associated with folding the foldable electronic device and a second reference value associated with unfolding the foldable electronic device based on the magnetic force value.

20 Claims, 19 Drawing Sheets

(51) Int. Cl.
   *G09F 9/30* (2006.01)
   *H04M 1/02* (2006.01)
(52) U.S. Cl.
   CPC ............ *G06F 1/1652* (2013.01); *G09F 9/301* (2013.01); *H04M 1/0214* (2013.01)

(56) References Cited

U.S. PATENT DOCUMENTS

| | | |
|---|---|---|
| 2014/0202014 A1 | 7/2014 | Choi et al. |
| 2017/0075640 A1 | 3/2017 | Chun et al. |
| 2017/0206049 A1* | 7/2017 | Choi .................... G06F 1/1641 |
| 2017/0208157 A1 | 7/2017 | Kim et al. |
| 2019/0245955 A1* | 8/2019 | Lee ..................... H04M 1/0268 |
| 2020/0333834 A1* | 10/2020 | Seo ........................ G09G 5/391 |
| 2020/0333836 A1* | 10/2020 | Kim ..................... G06F 1/1677 |
| 2020/0379516 A1* | 12/2020 | Park ..................... G06F 1/1652 |
| 2020/0389578 A1* | 12/2020 | Lee ..................... H04M 1/0243 |
| 2021/0018957 A1* | 1/2021 | Cho ..................... G06F 1/1681 |
| 2021/0041912 A1 | 2/2021 | Eom et al. |
| 2021/0105350 A1* | 4/2021 | Kim .................... H04M 1/0214 |
| 2022/0044607 A1 | 2/2022 | Kim et al. |

FOREIGN PATENT DOCUMENTS

| | | |
|---|---|---|
| CN | 111103965 A | 5/2020 |
| JP | 2011151455 A | 8/2011 |
| KR | 20030081546 A | 10/2003 |
| KR | 20060054542 A | 5/2006 |
| KR | 20080025881 A | 3/2008 |
| KR | 20140094333 A | 7/2014 |
| KR | 20170086369 A | 7/2016 |
| KR | 20170031525 A | 3/2017 |
| KR | 20210017038 A | 2/2021 |
| KR | 20210101089 A | 8/2021 |

* cited by examiner (410)

| ANGLE | 0 | 10 | 20 | 30 | 40 | 50 | 60 | 70 | 80 | 90 | 100 | 110 | 120 | 130 | 140 | 150 | 160 | 170 | 180 |
|---|---|---|---|---|---|---|---|---|---|---|---|---|---|---|---|---|---|---|---|
| X | 0 | 10 | 12 | 23 | 26 | 36 | 46 | 48 | 47 | 66 | 98 | 107 | 118 | 154 | 177 | 206 | 243 | 274 | 284 |
| Y | -308 | -362 | -431 | -534 | -675 | -815 | -941 | -1094 | -1109 | -1416 | -2065 | -2211 | -2447 | -3477 | -3929 | -4645 | -5596 | -6380 | -6725 |
| Z | 705 | 739 | 776 | 875 | 997 | 1143 | 1251 | 1376 | 1371 | 1611 | 2002 | 2064 | 2152 | 2454 | 2511 | 2464 | 2192 | 1780 | 1539 |

| ANGLE | 0 | 10 | 20 | 30 | 40 | 50 | 60 | 70 | 80 | 90 | 100 | 110 | 120 | 130 | 140 | 150 | 160 | 170 | 180 |
|---|---|---|---|---|---|---|---|---|---|---|---|---|---|---|---|---|---|---|---|
| X | 27 | 43 | 55 | 65 | 92 | 103 | 179 | 178 | 218 | 318 | 336 | 426 | 512 | 621 | 869 | 843 | 1218 | 1242 | 1343 |
| Y | -107 | -275 | -471 | -671 | -882 | -1007 | -1391 | -1387 | -1663 | -2285 | -2394 | -2975 | -3571 | -4246 | -5982 | -6759 | -8887 | -9099 | -9957 |
| Z | 1407 | 1482 | 1474 | 1524 | 1729 | 1736 | 2175 | 2161 | 2404 | 2841 | 2908 | 3256 | 3543 | 3780 | 4221 | 4122 | 3775 | 3655 | 3278 |

| ANGLE | 0 | 10 | 20 | 30 | 40 | 50 | 60 | 70 | 80 | 90 | 100 | 110 | 120 | 130 | 140 | 150 | 160 | 170 | 180 |
|---|---|---|---|---|---|---|---|---|---|---|---|---|---|---|---|---|---|---|---|
| X | 176 | 184 | 188 | 189 | 200 | 210 | 224 | 229 | 231 | 247 | 254 | 283 | 312 | 335 | 379 | 395 | 412 | 457 | 492 |
| Y | -512 | -555 | -630 | -709 | -824 | -1032 | -1158 | -1201 | -1276 | -1361 | -1713 | -2189 | -2665 | -3275 | -4017 | -4299 | -4582 | -5663 | -6985 |
| Z | 293 | 331 | 379 | 448 | 548 | 724 | 847 | 879 | 937 | 991 | 1227 | 1482 | 1738 | 1933 | 2080 | 2085 | 2090 | 2011 | 1105 |

(910)

FOLDABLE ELECTRONIC DEVICE AND METHOD FOR CONTROLLING FOLDABLE ELECTRONIC DEVICE

CROSS-REFERENCE TO RELATED APPLICATIONS

This application is based on and claims priority under 35 U.S.C. § 120 to PCT International Application No. PCT/KR2022/012433, filed on Aug. 19, 2022, and claims priority to Korean Patent Application No. 10-2021-0109484 filed on Aug. 19, 2021, in the Korean Intellectual Property Office, the disclosure of which are incorporated by reference herein their entirety.

TECHNICAL FIELD

Various embodiments of the disclosure disclose a foldable electronic device and a method of controlling a foldable electronic device.

BACKGROUND

With the development of digital technology, various types of electronic devices, such as a mobile communication terminal, a personal digital assistant (PDA), an electronic organizer, a smartphone, a tablet personal computer (PC), and a wearable device, have been widely used. An electronic device may have a limited size for portability, and thus the size of a display is also limited. Accordingly, in recent years, various types of electronic devices that provide a more expanded screen therein by a multi-display have been developed.

For example, a plurality of displays are provided to provide an expanded screen by a multi-display. As another example, electronic devices are designed such that the sizes of screens gradually increase in the displays having a limited size, and such that various services are provided to users through large screens. Such an electronic device may have a new form factor of, for example, a multi-display (e.g., dual-display) device (e.g., a foldable electronic device), a rollable device, or a slidable device. A foldable device may be equipped with a foldable (or flexible) display so that the foldable electronic device can be used in the state in which the foldable display is folded or in the state in which the foldable display is unfolded. The rollable device or the slidable device may include a flexible display mounted thereon, and the flexible display may be rolled to the rear surface of the rollable device to be stored, or the flexible display may be expanded to the front surface of the rollable device to be used.

DISCLOSURE

Technical Problem

A foldable electronic device including opposing first and second housing, which are folded relative to each other with reference to a folding axis may include an analog Hall sensor to detect whether or not the device is folded, and may include a magnet corresponding to the analog Hall sensor. A magnetic flux density of operating point (BOP) or a magnetic flux density of returning (or release) point (BRP) of an analog Hall sensor is fixed, so it may be important to secure a magnetic force for operating the analog Hall sensor. The foldable electronic device can determine an unfolded state (e.g., an opened state) or a folded state (e.g., a closed state) depending on whether or not a magnetic force value satisfying the BOP/BRP value is detected by the analog Hall sensor. When the magnetic force of a magnet disposed to correspond to the analog Hall sensor is not sufficient (e.g., the magnetic force is weak), the magnetic force necessary to satisfy the fixed BOP/BRP may not be detected, and thus an error may occur in determining the folded/unfolded state.

Solution to Problem

According to various embodiments of the disclosure, a foldable electronic device can include a first housing and a second housing disposed on opposite sides with reference to a folding axis and provided to be folded relative to each other. A first sensor module can be disposed in the first housing and a second sensor module can be disposed in the second housing. A digital Hall sensor can be disposed in one or both of the first housing or the second housing, and a magnet can be coupled to one or both of the first and second housings and can produce a magnetic field that can interact with the digital Hall sensor. A memory and a processor are operatively coupled to the first sensor module, the second sensor module, the digital Hall sensor, and the memory. The processor can calculate an angle between the first housing and the second housing based on sensing data measured by the first sensor module and the second sensor module, and obtain a measured magnetic force value from the digital Hall sensor when a state of the foldable electronic device corresponding to the calculated angle corresponds to a set condition. The processor can further set a first reference value associated with folding of the foldable electronic device and a second reference value associated with unfolding of the foldable electronic device based on the magnetic force value.

According to various embodiments of the disclosure, a method is provided for operating a foldable electronic device that includes a first housing and a second housing disposed on opposite sides with reference to a folding axis and that can be folded relative to each other. The method includes an operation of calculating an angle between the first housing and the second housing based on sensing data measured by a first sensor module disposed in the first housing and a second sensor module disposed in the second housing. The method further includes an operation of acquiring a measured magnetic force value from a digital Hall sensor of the foldable electronic device when a state of the foldable electronic device corresponding to the calculated angle corresponds to a set condition. The method further includes an operation of setting a first reference value associated with folding of the foldable electronic device and a second reference value associated with unfolding of the foldable electronic device based on the magnetic force value.

Various embodiments may disclose a method and device of updating a first reference value (BOP) and a second reference value (BRP) of a digital Hall sensor when a folded angle measured by a sensor module included in each of a first housing and a second housing, which are configured to be folded relative to each other in a foldable electronic device corresponds to a preset angle.

Advantageous Effects

As described herein, various embodiments of the disclosure provide a method and foldable electronic device to update a first reference value (BOP) and a second reference value (BRP) of a digital Hall sensor implemented in an foldable electronic device that includes opposing first and second housing that can be folded and unfolded relative to each other to define a folding angle therebetween Sensor modules coupled to the first and second housings output sensing data indicative of the folding angle. Embodiments of the disclosure include a processor that calculates the folding angle based on the sensing data, and variably sets (e.g., updates) a first reference value (BOP) and a second reference value (BRP) of corresponding to the Hall sensor when the calculated folding angle satisfies a set condition.

According to various embodiments, by variably setting and updating the first reference value (BOP) and the second reference value (BRP) of the digital Hall sensor, it is possible to increase the stability of determining the folded/unfolded state of the foldable electronic device and improve the accuracy of determining whether the foldable electronic device is folded or unfolded.

According to various embodiments, even when the magnetic force (or magnetic force value) detected by the digital Hall sensor is changed due to magnetization, the first reference value (e.g., the BOP) and the second reference value (e.g., the BRP) are updated depending on the changed magnetic force. As a result, it is possible to reduce an error in recognizing opening/closing of the foldable electronic device.

According to various embodiments, by setting the first reference value (e.g., the BOP) and the second reference value (e.g., the BRP) suitable for the foldable electronic device whenever a set condition corresponding to the folding angle of the foldable electronic device occurs, it is possible to stably use the foldable electronic device without being limited in magnetic design.

BRIEF DESCRIPTION OF DRAWINGS

FIG. 5A is a view illustrating a table showing magnetic force values according to angles of a foldable electronic device according to various embodiments.

FIG. 7A is a view illustrating a table showing magnetic force values according to angles of a foldable electronic device according to various embodiments.

FIG. 9A is a view illustrating a table showing magnetic force values according to angles of a foldable electronic device according to various embodiments after magnetization in the foldable electronic device.

BEST MODE

Figure 1:
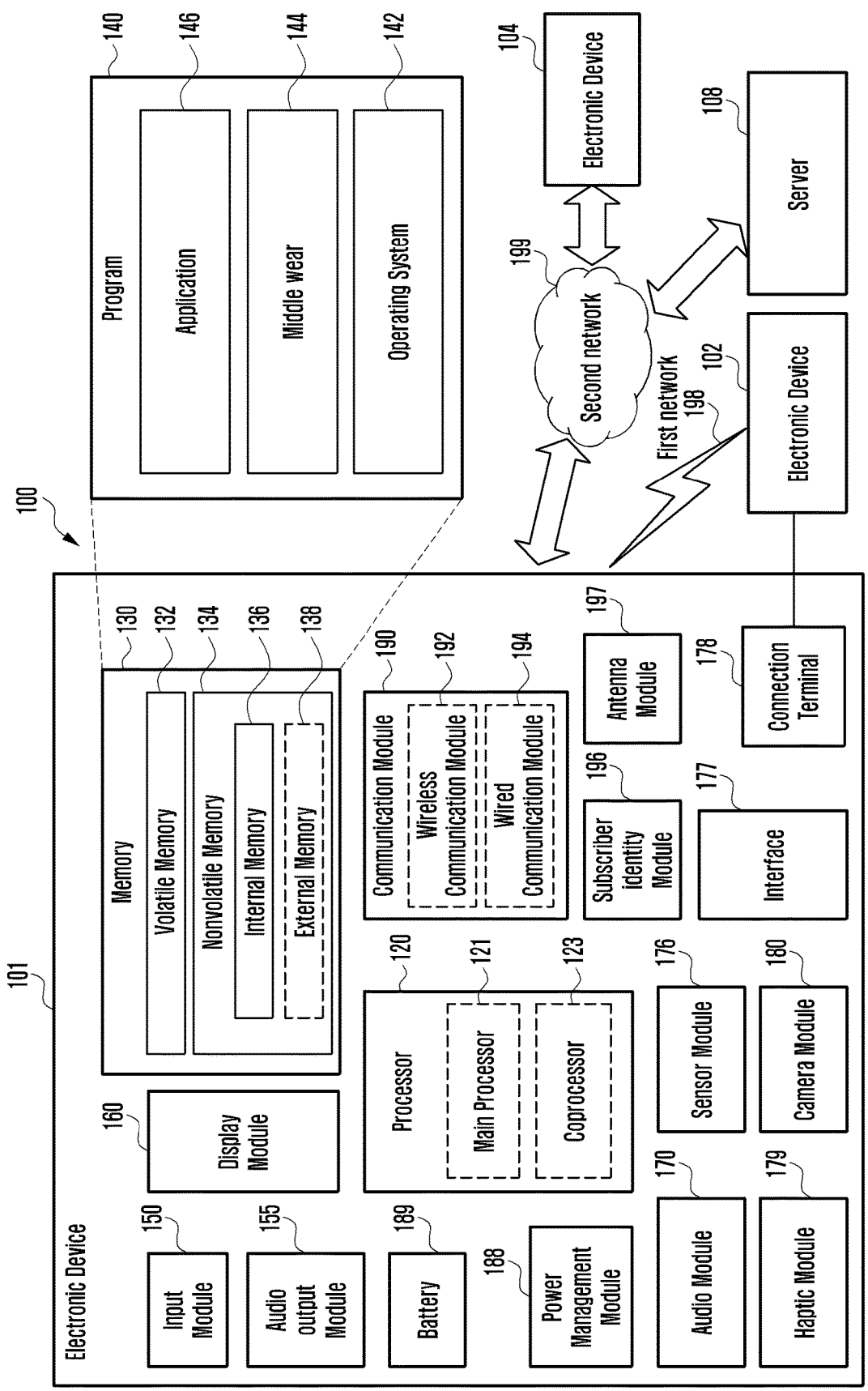
FIG. 1 is a block diagram of an electronic device according to various embodiments in a network environment.

FIG. 1 is a block diagram illustrating an electronic device 101 in a network environment 100 according to certain embodiments.

Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, an SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element composed of a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to certain embodiments, the antenna module 197 may form a mmWave antenna module. According to an embodiment, the mmWave antenna module may include a printed circuit board, an RFIC disposed on a first surface (e.g., the bottom surface) of the PCB, or adjacent to the first surface and capable of supporting a designated high-frequency band (e.g., the mmWave band), and a plurality of antennas (e.g., array antennas) disposed on a second surface (e.g., the top or a side surface) of the PCB, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to certain embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities, and some of the multiple entities may be separately disposed in different components. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 2A:
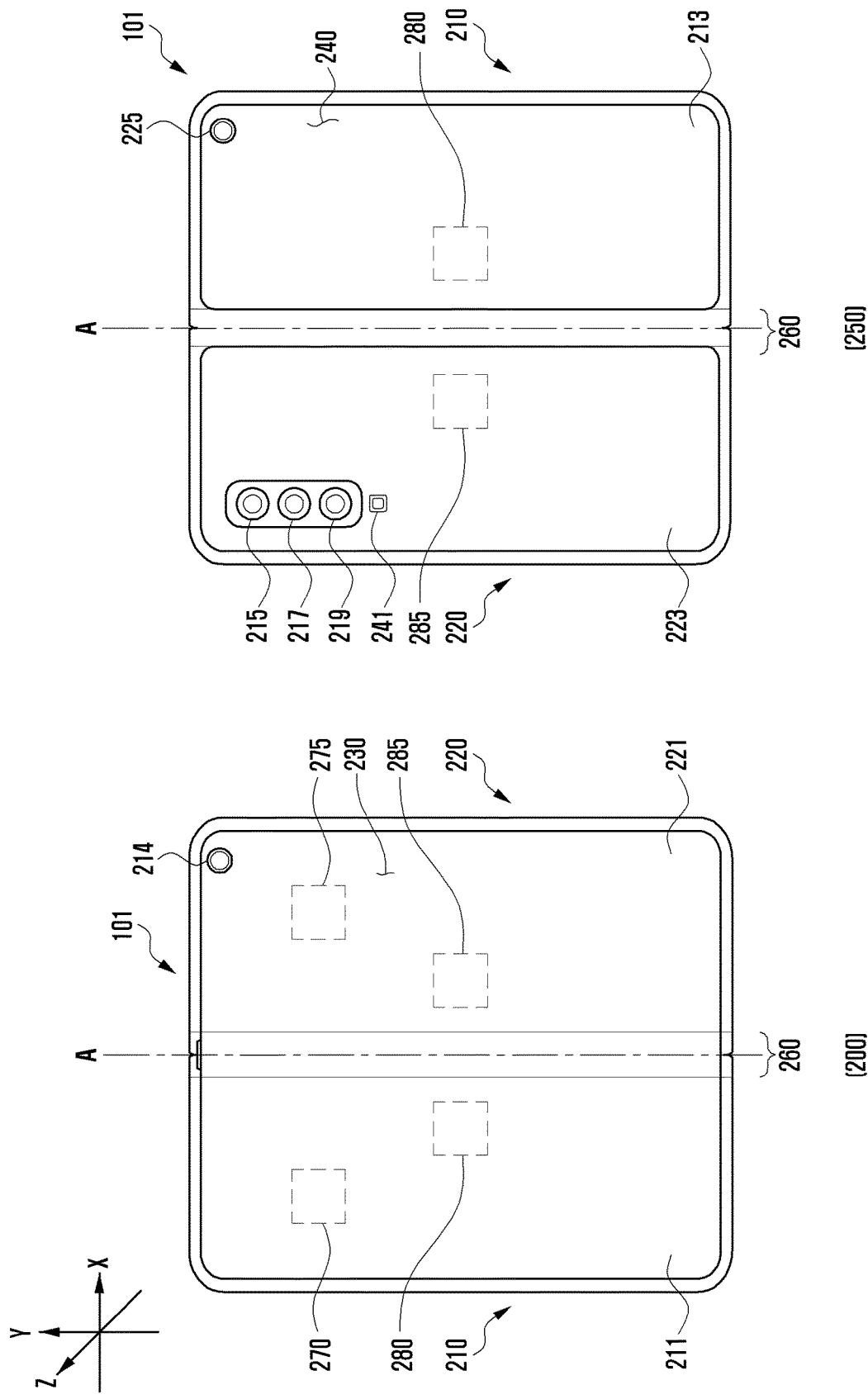
FIG. 2A is a view illustrating a foldable electronic device according to various embodiments in an unfolded state.

FIG. 2A is a view illustrating a foldable electronic device according to various embodiments in an unfolded state (e.g., an open state).

Referring to FIG. 2A, a foldable electronic device 101 (e.g., the electronic device 101 in FIG. 1) according to various embodiments may include a first housing 210 including a first surface 211 and a third surface 213 and a second housing 220 including a second surface 221 and a fourth surface 223. The first surface 211 of the first housing 210 and the second surface 221 of the second housing 220 may define the front surface 200 of the electronic device 101, and the third surface 213 of the first housing 210 and the fourth surface 223 of the second housing 220 may define the rear surface 250 of the electronic device 101.

The first housing 210 and the second housing 220 can be disposed on opposite sides with reference to a folding axis (e.g., axis A), and may have a generally symmetrical shape with respect to the folding axis. Referring to the front surface 200 of the electronic device 101 relative to the folding axis, for example, the first housing 210 may be on the left side of the electronic device 101 and the second housing 220 may be on the right side of the electronic device 101. Accordingly, the first housing 210 and the second housing 220 can fold relative to each other. According to a non-limiting embodiment, a hinge structure 260 is provided between the first housing 210 and the second housing 220 so that the front surface 200 of the electronic device 101 is foldable.

The angle or distance between the first housing 210 and the second housing 220 can vary depending on whether the electronic device 101 is in an unfolded state (e.g., an opened state), a folded state (e.g., a closed) state, or an intermediate state (e.g., a position between the opened state and the closed state. For example, the unfolded state may refer to an open state or a flat state. The unfolded state is a state in which the first housing 210 and the second housing 220 are arranged side by side. According to embodiments of the disclosure, the unfolded state may refer a state in which the electronic device 101 is fully unfolded. In the unfolded state, for example, the angle between the first housing 210 and the second housing 220 is 180 degrees, and the first surface 211 of the first housing 210 and the second surface of the second housing 220 may be positioned to be oriented in the same direction (e.g., the first direction). According to an embodiment of the disclosure, FIG. 2A is a view illustrating the front surface 200 of the electronic device 101 and the rear surface 250 of the electronic device 101 in the state in which the electronic device 101 is unfolded.

According to an embodiment of the disclosure, the folded state may refer to a closed state (see FIG. 2B), in which the first housing 210 and the second housing 220 are disposed to face each other. According to embodiments of the disclosure, and the folded state may refer to a state in which the electronic device 101 is fully folded. In the folded state, the first housing 210 and the second housing 220 form a narrow angle (e.g., 0 degrees to 5 degrees) therebetween, and the first surface 211 of the first housing 210 and the second surface 221 of the second housing 220 may face each other. Various embodiments described herein describe the electronic device 101 can be folded and unfolded in terms of an in-folding type device. It should be appreciated, however, that the electronic device 101 can be folded and unfolded in terms of an out-folding type device without departing from the scope of the invention.

Figure 2B:
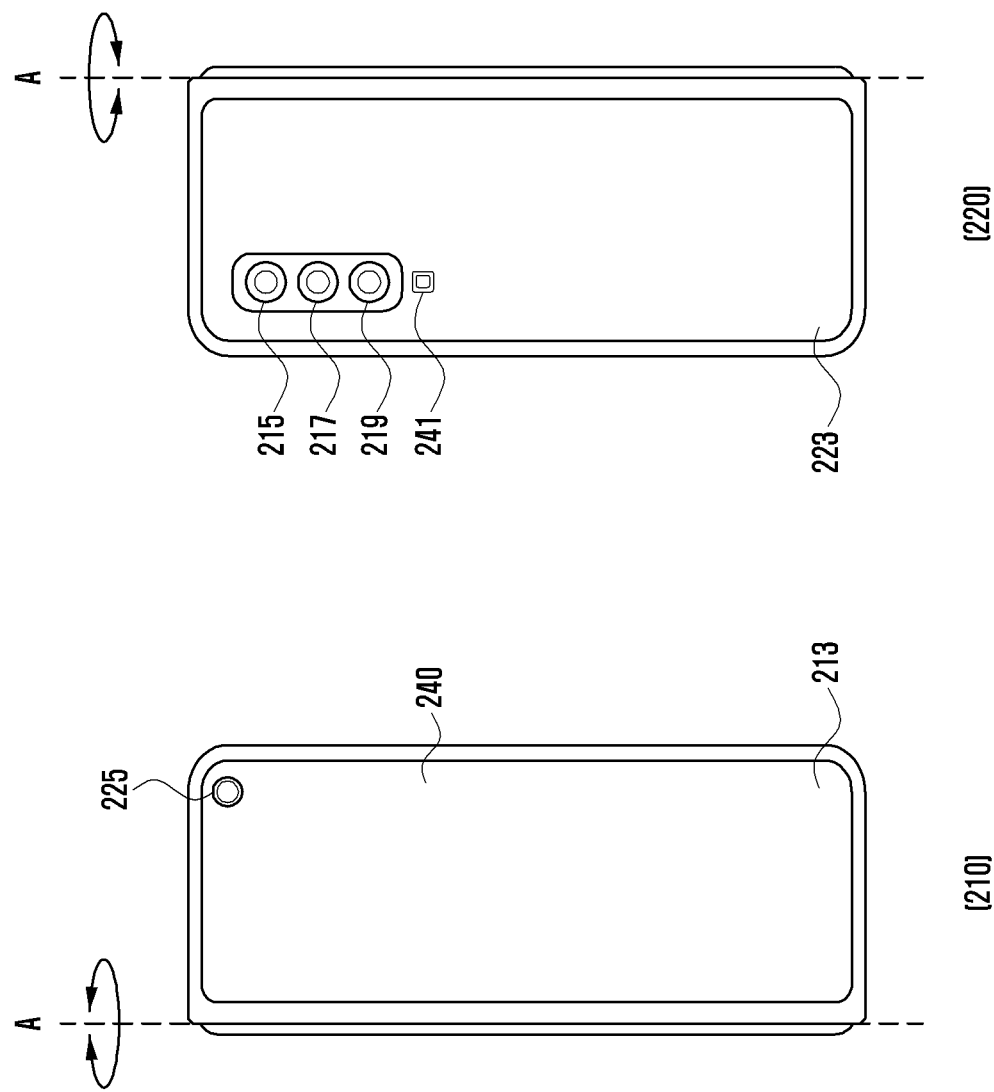
FIG. 2B is a view illustrating a foldable electronic device according to various embodiments in a folded state.
Figure 2C:
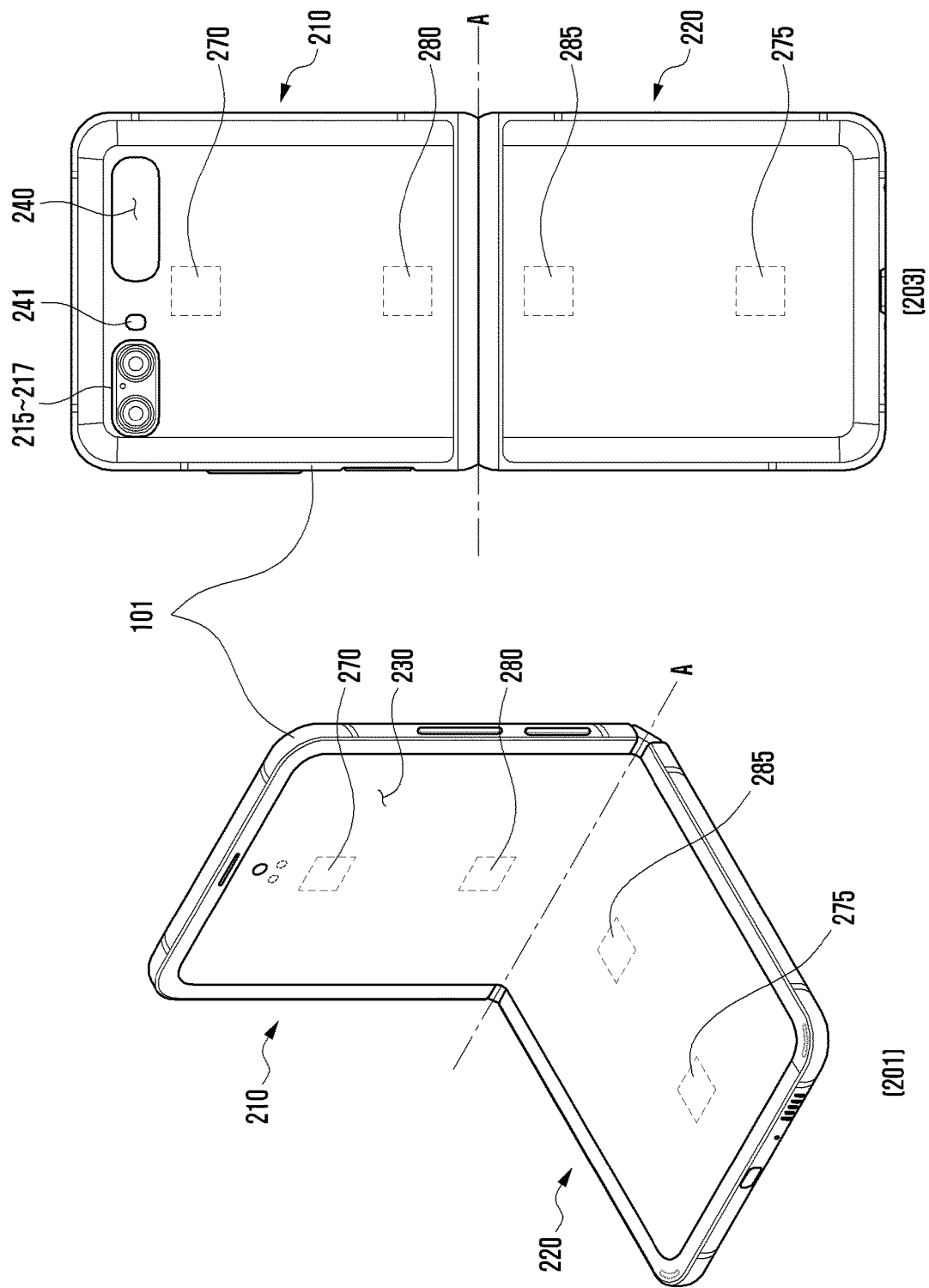
FIG. 2C is a view illustrating a foldable electronic device according to various embodiments in an intermediate state or in a folded state.

The intermediate state is a folding state in which the first housing 210 and the second housing 220 are positioned at an angle relative to each other such that the electronic device 101 is neither in the unfolded state nor in the folded state (see FIG. 2C). According to embodiments of the disclosure, the intermediate state may refer to a folding state in which the first surface 211 of the first housing 210 and the second surface 221 of the second housing 220 are positioned to form an angle therebetween. According to non-limiting embodiments, the angle corresponding to an intermediate state includes, for example, about 6 degrees to about 179 degrees). It should appreciated, however, that the angle of the intermediate state is not limited thereto.

According to embodiments of the disclosure, the electronic device 101 can be provided with a first display 230 (e.g., a main display) (e.g., the display module 160 in FIG. 1) on the first surface 211 and the second surface 221, which correspond to the front surface 200 of the electronic device. According to embodiments of the disclosure, the first display 230 can be provided on the entire front surface 200 (e.g., in the first direction of the electronic device 101) and can be folded (e.g., in left and right directions) with respect to the folding axis (e.g., axis A). According to embodiments, the first display 230 may be a flexible display in which at least a partial region is deformable into a flat surface or a curved surface. The first display 230 may include a first display region corresponding to the first surface 211 or a second display region corresponding to the second surface 221. In addition, the electronic device 101 may include a first camera 214 disposed on the second surface 221. The drawing illustrates non-limiting embodiments where the electronic device 101 implements a single first camera 214, but it should be appreciated that a plurality of first cameras 214 can be implemented without departing from the scope of the invention. In addition, although the drawing illustrates an example where the first camera 214 is disposed on the second surface 221, it should be appreciated that the first camera 214 can be provided on the first surface 211 without departing from the scope of invention.

In addition, the electronic device 101 can be provided with a second display 240 (e.g., a sub-display or a cover display) (e.g., the display module 160 in FIG. 1) in a portion of the rear surface 250 thereof. The second display 240 may be provided in at least a portion of the third surface 213 of the electronic device 101. The electronic device 101 may include a one or more rear cameras (e.g., 215, 217, 219, and 225) on the rear surface 250 thereof. For example, in the electronic device 101, a second camera 215, a third camera 217, a fourth camera 219 may be disposed on the fourth surface 223, while a fifth camera 225 may be disposed on the third surface 213. According to various embodiments, the performance (e.g., angle of view, resolution) of the second camera 215, the third camera 217, the fourth camera 219, and the fifth camera 225 can be the same type of cameras. In other non-limiting embodiments one or more of the rear cameras 215, 217, 219, and 225 or can be a different types of cameras. For example, the second camera 215 may have an angle of view greater than 125 degrees (e.g., an ultra-wide angle of view), the third camera 217 may have an angle of view of 90 to 125 degrees (e.g., a wide angle of view), the fourth camera 219 may have an angle of view of 90 degrees with a 2× zoom function (e.g., a telescopic function), and the fifth camera 225 may have an angle of view of 90 degrees with a normal magnification. The electronic device 101 may further include a sensor region 241 on the fourth surface 223. Similar to the sensor module 176 of FIG. 1, an infrared sensor, a fingerprint sensor, or an illuminance sensor may be disposed in the sensor region 241.

According to various embodiments, when the electronic device 101 is in the unfolded state (see FIG. 2A), the first display 230 may be turned on (or activated) and the second display 240 may be turned off (or inactivated). When a user input (e.g., a touch or button selection) is not detected for a predetermined period of time (e.g., 5 seconds, 10 seconds, or 1 minute) while the first display 230 is turned on, the electronic device 101 may turn off the first display 230. According to an embodiment, when a user input (e.g., a touch or button selection) is detected in the second display 240 while the second display 240 is turned off, the electronic device 101 may turn on the second display 240. According to various embodiments, when the second display 240 is turned on, the first display 230 may be turned off. According to an embodiment, even when the second display 240 is turned on, the electronic device 101 may maintain the first display 230 in the ON state for a predetermined period of time, and then when a user input is not detected on the first display 230 even after a predetermined period of time has elapsed, the electronic device 101 may turn off the first display 230.

The electronic device 101 may further include one or more sensor modules (e.g., sensor module 176 shown in FIG. 1) on the front surface 200 of the electronic device 101. According to various embodiments of the disclosure, the electronic device 101 includes a first sensor module 270 in the first housing 210 and a second sensor module 275 in the second housing 220. The first sensor module 270 and the second sensor module 275 can measure the folding angle between the first housing 210 and the second housing 220 and output a measurement signal indicative of the measured folding angle. The first sensor module 270 or the second sensor module 275 can include one or a combination of an acceleration sensor, a gyroscope sensor, a geomagnetic sensor, a proximity sensor, a gesture sensor. The acceleration sensor is a sensor that detects a speed, and the gyroscope sensor may detect an angular velocity that is a rotation speed of an object. The geomagnetic sensor is a sensor that detects geomagnetism, and like a compass, the geomagnetic sensor may detect geomagnetism directions (e.g., azimuth) such as east, west, south, and north. The proximity sensor detects whether an object is present close thereto, and the gesture sensor may detect infrared rays.

According to embodiments of the disclosure, the electronic device 101 detects a state of the electronic device 101 (e.g., an unfolded state, a folded state, or an intermediate state) using the first sensor module 270 and the second sensor module 275. With reference to an example in which the front surface 200 of the electronic device 101 is positioned into a given state (an unfolded state, a folded state, or an intermediate state), the x axis of the first sensor module 270 or the second sensor module 275 may indicate a left/right direction, the y axis may indicate a front/rear direction, and the z axis may indicate a height direction. When the front surface 200 of the electronic device 101 is positioned into a given state, the x-axis, y-axis, and z-axis sensing data (or sensing values or sensing angles) measured (or acquired) by the first sensor module 270 or the second sensor module 275 may be the same as or similar to each other.

According to a non-limiting embodiment, the electronic device 101 can be positioned into a folded state, an unfolded state or an intermediate state such that the first sensor module 270 and/or the second sensor module 275 can measure (or acquire) folding data of the front surface 200 and/or the second surface 250. the x-axis and y-axis sensing data measured (or acquired) by the first sensor module 270 or the second sensor module 275 may be expressed as 0° in angle, and the z-axis sensing data may be expressed 90° in angle. When the rear surface 250 of the electronic device 101 is placed as in the state, the x-axis and y-axis sensing data measured (or acquired) by the first sensor module 270 or the second sensor module 275 may be 0°, and the z-axis sensing data may be −90°. Since the x-axis and y-axis sensing data of the first sensor module 270 or the second sensor module 275 are not affected by the direction of gravity and the z-axis sensing data is affected by the direction of gravity, the z-axis sensing data when the front surface 200 of the electronic device 101 is in the state and the z-axis sensing data when the rear surface 250 of the electronic device 101 is placed in the state may be different from each other.

According to embodiments of the disclosure, the electronic device 101 includes a digital Hall sensor 280 and a magnet 285 that generates a magnetic force which can interact with the digital Hall sensor 280. In a non-limiting embodiment, the digital Hall sensor 280 is installed in the first housing 210 and a magnet 285 in the second housing 220.

According to embodiments of the invention, the digital Hall sensor 280 can detect a change in an electrical signal based on proximity or distance of an object having a magnetic force (e.g., magnet 285). The digital Hall sensor 280 can measure (or sense or detect) a magnetic force value (e.g., a magnetic field strength), and transmit the measured magnetic force value to a processor (e.g., the processor 120 in FIG. 1). The digital Hall sensor 280 can also generate (or output) an interrupt signal depending on whether or not the measured magnetic force value (e.g., the magnetic field strength) corresponds to one or more reference values. The reference values include, for example, a first reference value which is a threshold set in the digital Hall sensor 280 to determine folding of the electronic device 101, and a second reference value which is a threshold set in the digital Hall sensor 280 to determine unfolding of the electronic device 101. For example, when the measured magnetic force value meets (is equal to or greater than) the first reference value, the digital Hall sensor 280 outputs (or transmits) a first interrupt signal (e.g., "interrupt high") to the processor 120, and when the measured magnetic force value meets (is equal to or smaller than) the second reference value, the digital Hall sensor 280 may outputs (or transmits) a second interrupt signal (e.g., "interrupt low") to the processor 120.

According to various embodiments, when the first interrupt signal is "interrupt high", the second interrupt signal may be "interrupt low", and when the first interrupt signal is "interrupt low", the second interrupt signal may be "interrupt high". This may vary depending on the setting of the electronic device 101. This is provided only for helping the understanding of the disclosure, and the disclosure is limited thereto. The processor 120 can determine whether the electronic device 101 is in the folded state or the unfolded state based on the first interrupt signal or the second interrupt signal. For example, when receiving the first interrupt signal from the digital Hall sensor 280, the processor 120 recognizes that the electronic device 101 is folded and when receiving the second interrupt signal from the digital Hall sensor 280, the processor 120 recognizes that electronic device 101 is unfolded. Accordingly, the processor 120 can control the operation of the electronic device 101 based on the folded state of the electronic device 101.

The magnet 285 affects the magnetic force of the digital Hall sensor 280, and is located on the electronic device 101 such that it can interact with the digital Hall sensor 280. Accordingly, the digital Hall sensor 280 can measure magnetic force values corresponding to the x axis, y axis, and z axis based its position with respect to the magnet 285. Since it is possible to set the first reference value and the second reference value for each axis, the first reference value and the second reference value can be set based on the axis in which the largest magnetic force difference occurs depending on the folding angle of the electronic device 101. For example, an axis on which the first reference value and the second reference value are set can be determined based on the arrangement structure of the magnet 285 and the digital Hall sensor 280. Hereinafter, an example in which magnetic values corresponding to the y axis are set as the first reference value and the second reference value will be described. However, magnetic values corresponding to the x axis or the y axis may be set as the first reference value and the second reference value. These examples are only provided to help the understanding of the disclosure, and the disclosure is not limited thereto.

FIG. 2B is a view illustrating a foldable electronic device according to various embodiments in the folded state (e.g., a closed state).

Referring to FIG. 2B along with continued reference to FIG. 2A, the hinge structure 260 (see FIG. 2A) may be provided around the folding axis (e.g., axis A) so that the front surface 200 (see FIG. 2A) can be positioned in the folded state (e.g., the closed state). According to an embodiment illustrated in FIG. 2B, when the electronic device 101 is in the unfolded state (e.g., the closed state), the third surface 213 of the first housing 210 and the fourth surface 223 of the second housing 220 are exposed, while the first surface 211 of the first housing 210 and the second surface 221 of the second housing 220 are concealed.

According to various embodiments, when the electronic device 101 is in the folded state, the first display 230 may be turned off and the second display 240 may be turned on. When a user input is not detected for a predetermined period of time while the second display 240 is turned on, the electronic device 101 may turn off the second display 240. While the electronic device 101 is in the folded state and the second display 240 is turned off, the electronic device 101 may turn on the second display 240 when a button provided (or installed) on the electronic device 101 is selected. According to an embodiment of the disclosure, while the electronic device 101 is in the folded state, when a user input is detected on the second display 240 after the second display 240 is turned off, the electronic device 101 can turn on the second display 240.

According to various embodiments, when the electronic device 101 is in the folded state, the z-axis sensing data measured (or acquired) by the first sensor module 270 may be different from the z-axis sensing data measured (or acquired) by the second sensor module 275. For example, when the third surface 213 of the first housing 210 is placed to be oriented in a first direction (e.g., the direction opposite to the direction of gravity) (e.g., the state in which the fourth surface 223 of the second housing 220 is placed to be oriented in a second direction (e.g., the direction of gravity)), the x-axis and y-axis sensing data measured by the first sensor module 270 may be 0°, and the z-axis sensing data measured by the first sensor module 270 may be −90° while the x-axis and y-axis sensing data measured by the second sensor module 275 may be 0° and the z-axis sensing data measured by the second sensor module 275 may be 90°. The first direction and the second direction may be opposite to each other. In addition, when the fourth surface 223 of the second housing 220 is placed to be oriented in the first direction (e.g., the state in which the third surface 213 of the second housing 210 is placed to be oriented in the second direction), the x-axis and y-axis sensing data measured by the first sensor module 270 may be 0°, and the z-axis sensing data measured by the first sensor module 270 may be 90° while the x-axis and y-axis sensing data measured by the second sensor module 275 may be 0° and the z-axis sensing data measured by the second sensor module 275 may be FIG. 2C is a view illustrating a foldable electronic device in an intermediate state or in an unfolded state according to various embodiments of the disclosure. The embodiments illustrated in FIGS. 2A and 2B is an example of an foldable electronic device 101 in which a first length of two parallel side surfaces (e.g., the upper and lower side surfaces) is similar to a second length of other two parallel side surfaces (e.g., the left and right surfaces), while the embodiment illustrated in FIG. 2C is an example of a foldable electronic device 101 in which a first length of two parallel side surfaces (e.g., the upper and lower side surfaces) is greater or smaller than a second length of other two side surfaces (e.g., the left and right side surfaces). The foldable electronic device of FIGS. 2A and 2B and the foldable electronic device of FIG. 2C may be the same as or similar to each other in structure or operation, even though the external appearances thereof different from each other.

Referring to FIG. 2C, the foldable electronic device 101 includes a hinge structure 260 which is provided around a folding axis (e.g., axis A). Accordingly, the foldable electronic device 101 can be positioned into an intermediate state (201) such that the first housing 210 and the second housing 220 form an angle therebetween. When positioned in the intermediate state (201), a surface of the second housing 220, for example, can be placed on an object (e.g., the floor), while the first housing 210 is not placed on the object such that an angle is defined therebetween. While the drawing illustrates the second housing 220 placed on the object, it should be appreciated that the first housing 210 can be placed on an object, while the second housing 220 is not placed on the object such that an angle is defined therebetween.

According to various embodiments, in the intermediate state (201), the first display 230 may be activated, and a user interface may be displayed on the first display 230. The user interface may be displayed on the entire screen of the first display 230 or divided into two portions (or regions) like split screens. According to an embodiment of the disclosure, in the intermediate state, an output unit (e.g., an application execution screen) may be displayed on the first surface 211 of the first housing 210, and an input unit (e.g., a keypad) may be displayed on the second surface 221 of the second housing 220.

Referring to the rear surface 203, a cover display (e.g., the display module 160 in FIG. 1 or the second display 240 in FIGS. 2A to 2C) may be included in the third surface 213 of the first housing 210 which is a portion of the rear surface 203 of the electronic device 101 in the state. A plurality of cameras 215-217 and a sensor region 241 can be further included next to the second display 240.

According to an embodiment of the disclosure, the electronic device 101 can detect a state of the electronic device 101 (e.g., an unfolded state, a folded state, or an intermediate state) using the first sensor module 270 and the second sensor module 275. As described herein, various non-limiting embodiments of the electronic device 101 can provide a digital Hall sensor 280 in the first housing 210 and a magnet 285 in the second housing 220. In some non-limiting embodiments, the digital Hall sensor 280 can be provided in the second housing 220 while the magnet 285 is provided in the first housing 210.

According to various embodiments of the disclosure, a foldable electronic device 101 (e.g., the electronic device 101 in FIG. 1) includes a first housing 210 (e.g., the first housing 210 in FIGS. 2A to 2C), and a second housing 220 (e.g., the second housing 220 in FIGS. 2A to 2C) disposed on opposite sides with respect to a folding axis (axis A) (e.g., axis A in FIG. 2A). Accordingly, the first housing 210 can be folded relative to the second housing 220.

The foldable electronic device 101 can further include a first sensor module 270 (e.g., the first sensor module 270 in FIGS. 2A and 2C) installed in the first housing, a second sensor module 275 (e.g., the second sensor module 275 in FIGS. 2A and 2C) installed in the second housing; a digital Hall sensor 280 (e.g., the digital Hall sensor 280 in FIGS. 2A and 2C) installed in the first housing 210 or the second housing 220, a magnet (e.g., the magnet 285 in FIG. 2A) disposed to correspond to the at least one digital Hall sensor;

According to a non-limiting embodiment, the foldable electronic device 101 illustrated in FIG. 2C includes a memory 130 (e.g., the memory 130 in FIG. 1) and a processor 120 (e.g., the processor 120 in FIG. 1) operatively coupled to the first sensor module 270, the second sensor module 275, the digital Hall sensor 280, and/or the memory 130. The processor 120 can calculate an angle between the first housing 210 and the second housing 220 based at least in part on sensing data measured by the first sensor module 270 and the second sensor module 275, obtain a measured magnetic force value from the digital Hall sensor 280 when a folding state of the foldable electronic device 101 indicated by the calculated angle corresponds to a set condition. The processor 120 can further set a first reference value associated with folding the foldable electronic device 101 and a second reference value associated with unfolding the foldable electronic device 101 based at least in part on the magnetic force value.

According to an embodiment of the disclosure, the processor 120 can set the first reference value based on the magnetic force value obtained from the digital Hall sensor 280 at a time when the set condition is satisfied and a first reference set value; and set the second reference value based at least in part on the set first reference value and a second reference set value.

According to an embodiment of the disclosure, the processor 120 can receive an interrupt signal based on the first reference value or the second reference value from the digital Hall sensor 280, and control an operation of the foldable electronic device 101 based at least in part on the received interrupt signal.

According to an embodiment of the disclosure, the processor 120 may set a difference between the first reference value and the second reference value to be greater than or equal to a reference set value.

According to an embodiment of the disclosure, the processor can determine that a state of the foldable electronic device corresponds to the set condition when the calculated angle corresponds to a set angle (e.g., a target angle) and is maintained at the set angle for a predetermined time.

According to an embodiment of the disclosure, the processor 120 can determine that the foldable electronic device 101 is in a folded state when a first interrupt signal corresponding to the first reference value is received from the digital Hall sensor, and control an operation of the foldable electronic device 101 in response to the folded state. The processor 120 can further determine that the foldable electronic device 101 is in an unfolded state when a second interrupt signal corresponding to the second reference value is received from the digital Hall sensor 280, and control the operation of the foldable electronic device 101 in response to the unfolded state.

According to an embodiment of the disclosure, the processor 120 can designate a first reference set value and a second reference set value, and acquire a plurality of magnetic force values corresponding to a set angle range between the first housing and the second housing from the digital Hall sensor 280. The processor 120 can further calculate a first difference value between two magnetic force values corresponding to a first angle range and a second difference value between two magnetic force values corresponding to a second angle range, determine the first difference value as the first reference set value when the first difference value exceeds the first reference set value, and determine the first reference set value as the designated first reference set value when the first difference value is equal to or less than the first reference set value.

According to an embodiment of the disclosure, the processor 120 can determine whether the second difference value exceeds the second reference set value, determine the second difference value as the second reference set value when the second difference value exceeds the second reference set value, and determine the second reference set value as the designated second reference set value when the second difference value is equal to or less than the second reference set value.

According to an embodiment of the disclosure, the processor 120 to store the set first reference value or the second reference value in an inactive memory area included in the memory 130.

According to an embodiment of the disclosure, the processor 120 can determine whether the first reference value or the second reference value is stored in the inactive memory when the foldable electronic device 101 is booted, control an operation of the foldable electronic device 101 based at least in part on an interrupt signal corresponding to the stored first reference value and second reference value when the first reference value or the second reference value is stored, and execute a reference value setting process when the first reference value or the second reference value is not stored.

According to an embodiment of the disclosure, the reference value setting process can include acquiring the measured magnetic force value from the digital Hall sensor 280 when the folding state of the foldable electronic device 101 corresponding to the angle between the first housing 210 and the second housing 220 corresponds to a set condition. The first reference value and the second reference value can be set based at least in part on at least one of the magnetic force value, the first reference set value, or the second reference set value.

Figure 3:
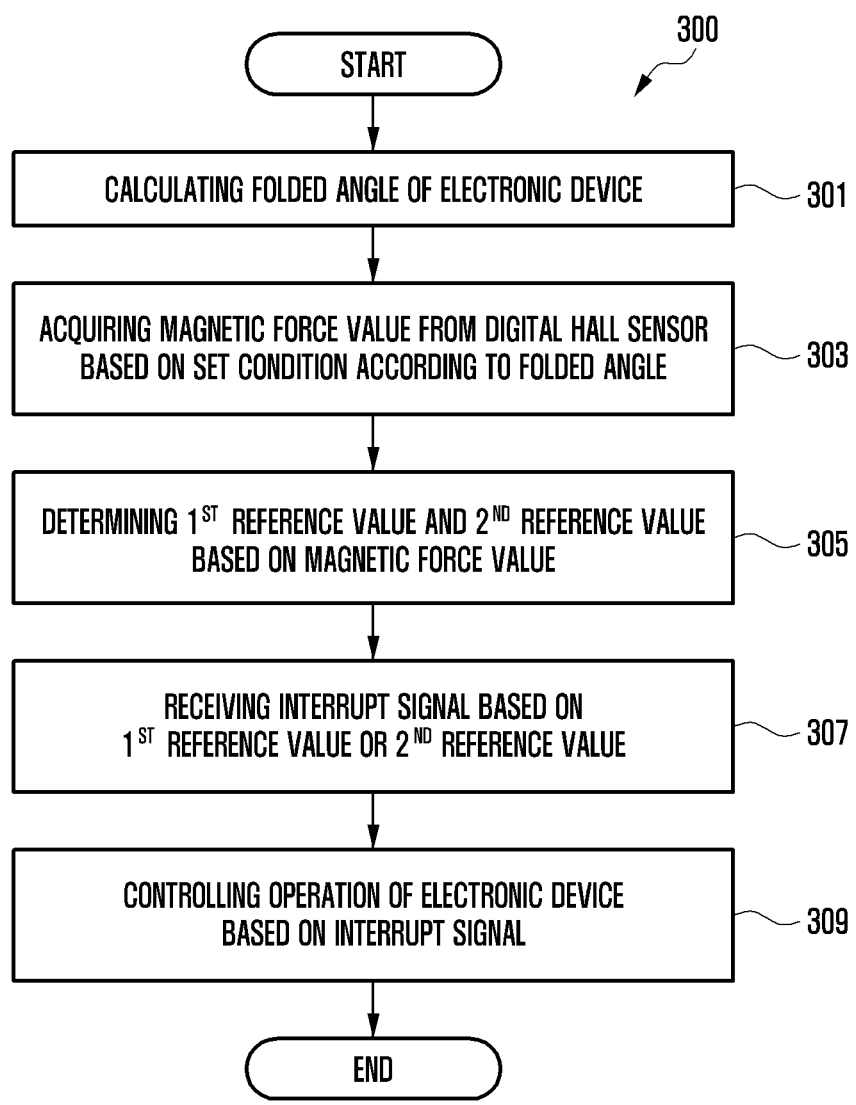
FIG. 3 is a flowchart illustrating a method of operating a foldable electronic device according to various embodiments.

FIG. 3 is a flowchart 300 illustrating a method of operating a foldable electronic device 101 according to various embodiments.

Referring to FIG. 3, in operation 301, a processor (e.g., the processor 120 in FIG. 1) of the foldable electronic device (e.g., the electronic device 101 in FIG. 1) according to various embodiments may calculate the folding angle of the electronic device 101. The electronic device 101 may include a first housing (e.g., the first housing 210 in FIGS. 2A to 2C) and a second housing (e.g., the second housing 220 in FIGS. 2A to 2C) on opposite sides with reference to the folding axis (e.g., axis A). The first housing 210 and the second housing 220 can be folded relative to each other. The electronic device 101 include a first sensor module (e.g., the first sensor module 270 in FIGS. 2A and 2C) in the first housing 210, and a second sensor module (the second sensor module 275 in FIGS. 2A and 2C) in the second housing 220. The processor 120 may calculate the angle (e.g., the folding angle) between the first housing 210 and the second housing 220 by using the first sensor module 270 and the second sensor module 275. For example, the processor 120 may acquire sensor data (or sensing values) measured (or sensed) by the first sensor module 270 and the second sensor module 275 in real time or periodically, and may calculate the folding angle based on the acquired sensor data.

In operation 303, the processor 120 acquires a magnetic force value from a digital Hall sensor (e.g., the digital Hall sensor 280 in FIGS. 2A and 2C) based on a set condition according to the folding angle. The electronic device 101 can include, for example, a digital Hall sensor 280 in the first housing 210 and a magnet 285 in the second housing 220. The digital Hall sensor 280 can detect a change in an electrical signal based on proximity or distance of an object having a magnetic force (e.g. the magnet 285). The magnet 285 affects the magnetic force of the digital Hall sensor 280, and can be arranged at location capable of interacting with the digital Hall sensor 280. The digital Hall sensor 280 can measure (or sense or detect) a magnetic force value, and transmit the measured magnetic force value to the processor

120. The processor 120 can acquire the magnetic force value from the digital Hall sensor 280 in real time (or continuously or always) or periodically.

According to various embodiments, the set condition may include that the folding angle corresponds to a set angle (e.g., a target angle) and is maintained at the set angle for a predetermined period of time. The set angle can be defined as about 10 degrees or less, for example, and the period of time can range, for example, about 1 second to about 3 seconds. When the electronic device 101 satisfies the set condition, the processor 120 can acquire the magnetic force value measured by the digital Hall sensor 280 at a time when the set condition is satisfied.

In operation 305, the processor 120 can determine (or set) a first reference value and a second reference value based on the acquired magnetic force value. The first reference value is a value set in the digital Hall sensor 280 to determine folding of the electronic device 101, and is indicative of a magnetic flux density corresponding to operating point (BOP). When referring to the term "BOP", "B" refers to magnetic flux density, and "OP" refers to operating point. The second reference value is a value set in the digital Hall sensor 280 to determine unfolding of the electronic device 101, and is indicative of a magnetic flux density corresponding to returning point (BRP). When referring to the term "BRP", "B" refers to "magnetic flux density", and "RP" refers to returning (or release) point.

According to an embodiment of the disclosure, the digital Hall sensor 280 can be initially set (e.g., calibrated) with the first reference value and the second reference value. The initial first reference value and initial second reference value can then be subsequently changed (e.g., updated or re-calibrated) when the electronic device 101 satisfies the set condition. In other words, various embodiments of the disclosure provide an electronic folding device 101, of which the folded state can be stably determined by variably setting (e.g., updating) the first reference value and the second reference value in the digital Hall sensor 280 in response to satisfying a set condition such as, for example, the folding angle corresponding to a set angle (e.g., a target angle) that is maintained for a predetermined period of time.

According to various embodiments of the disclosure, the processor 120 can set the first reference value BOP based on the magnetic force value H acquired from the digital Hall sensor 280 and a first reference set value (e.g., BOP_delta) and can set the second reference value BRP based on the set first reference value BOP and a second reference set value BRP_delta. For example, the processor 120 can set the first reference value by subtracting the first reference set value from the magnetic force value H (e.g., BOP=H−BOP_delta) and can set the second reference value by subtracting the second reference set value from the first reference value (e.g., BRP=BOP−BRP_delta).

When the difference between the first reference value and the second reference value is a value (e.g., 70 microteslas (uT)) close to the earth's magnetic field (e.g., 40 uT to 60 uT), an error may occur in determining the folded state of the electronic device 101 due to the earth's magnetic field. It should be appreciated that a microtesla (uT) is a unit used for measuring magnetic fields. Accordingly, the processor 120 can designate the first reference set value (e.g., 100 uT) or the second reference set value (e.g., 100 uT). In addition, a deviation may occur in the first sensor module 270 or the second sensor module 275 for each electronic device 101. Accordingly, the initial set value associated with reference value setting may be designated as an appropriate value through a distribution in the electronic device 101. For example, the processor 120 can designate a first initial set value INIT_BOP associated with the first reference value and a second initial set value ININ_BRP associated with the second reference value.

According to various embodiments, when the first difference value acquired in response to the first angle range exceeds the first reference set value, the processor 120 can set the acquired first difference value as the first reference set value, and when the acquired first difference value is equal to or less than the first reference set value, the processor 120 can determine the designated first reference set value as the first reference set value as it is. When the second difference value acquired in response to the second angle range exceeds the second reference set value, the processor 120 can set the acquired second difference value as the second reference set value, and when the acquired second difference value is equal to or less than the second reference set value, the processor 120 can determine the designated second reference set value as the second reference set value as it is. Accordingly, the processor 120 can prevent an error from occurring in determining the folded state of the electronic device 101 due to the earth's magnetic field.

The first angle range may range from 0 degrees to 10 degrees, and the second angle range may range from 10 degrees to 20 degrees. The processor 120 can acquire a first magnetic force value at an angle of 0 degrees between the first housing 210 and the second housing 220, a second magnetic force value at 10 degrees, and a third magnetic force value at 20 degrees. According to an embodiment, the processor 120 can acquire a first magnetic force value at an angle of 10 degrees between the first housing 210 and the second housing 220, a second magnetic force value at 20 degrees, and a third magnetic force value at 30 degrees. The first difference value can be acquired by subtracting the first magnetic force value from the second magnetic force value, and the second difference value can be acquired by subtracting the second magnetic force value from the third magnetic force value.

The processor 120 can set the difference between the first reference value and the second reference value to be greater than or equal to the second reference set value (or the first reference set value), and can transmit the set (or determined) first reference value and second reference value to the digital Hall sensor 280. The digital Hall sensor 280 can generate an interrupt signal based on the first reference value and the second reference value.

The digital Hall sensor 280 may be affected by a magnetic material, and when a magnetic material (e.g., a magnet-attached mobile phone case or vehicle cradle, or the like) approaches the electronic device 101, an offset may occur in the magnetic force value measured by the digital Hall sensor 280. When the magnetic force value of the digital Hall sensor 280 is changed, the digital Hall sensor 280 may not generate an interrupt signal even though the electronic device 101 is switched to the folded state. When the interrupt signal is not generated, an error that causes the processor 120 to recognize that the electronic device 101 is still in the unfolded state or the intermediate state may occur. In order to compensate for this disadvantage, an embodiment of the disclosure provides that the processor 120 can always perform operations 301 to 305 (see FIG. 3) based on a change in the folding angle of the electronic device 101. For example, when the user changes the folded state of the electronic device 101 (e.g., folded state→unfolded state, folded state→intermediate state, intermediate state→folded state, unfolded state→folded state), the processor 120 can actively set (or change) the first reference value and the second reference value.

According to various embodiments, the processor 120 can store the set (or determined) first reference value and second reference value in the memory (e.g., the memory 130 of FIG. 1). The processor 120 may store the set (or determined) first reference value and second reference value in a nonvolatile memory (e.g., the nonvolatile memory 134 in FIG. 1). When the first reference value and the second reference value are changed, the processor 120 can update the memory 130 with the changed values (in other words, updated first and second references values). When the electronic device 101 is booted, the processor 120 can read the first reference value and the second reference value stored in the nonvolatile memory 134 to control the operation of the electronic device 101.

In operation 307, the processor 120 can receive, from the digital Hall sensor 280, an interrupt signal based on the first reference value and the second reference value. For example, when the measured magnetic force value is equal to or greater than the first reference value, the digital Hall sensor 280 outputs (or transmits) a first interrupt signal (e.g., "interrupt high") to the processor 120, and when the measured magnetic force value is equal to or smaller than the second reference value, the digital Hall sensor 280 may output (or transmit) a second interrupt signal (e.g., "interrupt low") to the processor 120.

According to various embodiments, based on the first reference value, the digital Hall sensor 280 can generate the first interrupt signal when the folding angle meets a first angle (e.g., s 10 degrees). Based on the second reference value, the digital Hall sensor 280 can generate the second interrupt signal when the folding angle meets a second angle (e.g. 20 degrees). Thereafter, when the first reference value and the second reference value are changed, based on the changed first reference value, the digital Hall sensor 280 can generate the first interrupt signal when the folding angle is changed (e.g., when the folding angle 15 degrees). Based on the second reference value, the digital Hall sensor 280 may generate the second interrupt signal when the folding angle is changed (e.g., when the folding angle 25 degrees). According to the change of the first reference value and the second reference value, the angle determined as the folded state or the unfolded state may be changed.

In operation 309, the processor 120 can control the operation of the electronic device 101 based on the interrupt signal received from the digital Hall sensor 280. The electronic device 101 can include a main display is displayed on a main display (e.g., the display module 160 in FIG. 1 or the first display 230 in FIG. 2A and FIG. 2C) on the front surface (e.g., the first surface 211 and the second surface 221 in FIG. 2A) thereof. The electronic device 101 may include a cover display (e.g., the display module 160 in FIG. 1 or the second display 240 in FIGS. 2A to 2C) on a portion of the rear surface (e.g., the third surface 213 of FIG. 2A) of the electronic device 101. The first display 230 or the second display 240 may be a flexible display in which at least a partial region is deformable into a flat surface or a curved surface.

According to an embodiment of the disclosure, when receiving the first interrupt signal from the digital Hall sensor 280, the processor 120 can determine that the electronic device 101 is in the folded state, and can control the operation of the electronic device in response to the folded state of the electronic device 101. The processor 120 may turn off the first display 230 and turn on the second display 240, or may turn off both the first display 230 and the second display 240. The processor 120 may change at least one of the size, the ratio, or the layout of an execution screen of an application displayed on the first display 230 to be suitable for the second display 240. When the application executed on the first display 230 is a camera application, the processor 120 may switch a camera (e.g., the first camera 214→at least one of the second camera 215, the third camera 217, and the fourth camera 219). The processor 120 may change the size or ratio of the execution screen of the application displayed on the first display 230 to be suitable for the second display 240. According to an embodiment, the processor 120 may switch a touch panel (e.g., turning off the touch panel corresponding to the first display 230 and turning on the touch panel corresponding to the second display 240).

According to an embodiment of the disclosure, when receiving the second interrupt signal from the digital Hall sensor 280, the processor 120 can determine that the electronic device 101 is in the unfolded state (or the intermediate state), and can control the operation of the electronic device in response to the unfolded state of the electronic device 101. The processor 120 may turn off the second display 240 and turn on the first display 230. The processor 120 may change at least one of the size, the ratio, or the layout of an execution screen of an application displayed on the second display 240 to be suitable for the first display 230. When the application executed on the second display 240 is a camera application, the processor 120 may switch a camera (e.g., at least one of the second camera 215, the third camera 217, and the fourth camera 219→the first camera 214). The processor 120 may switch a touch panel (e.g., turning on the touch panel corresponding to the first display 230 and turning off the touch panel corresponding to the second display 240).

Figure 4A:
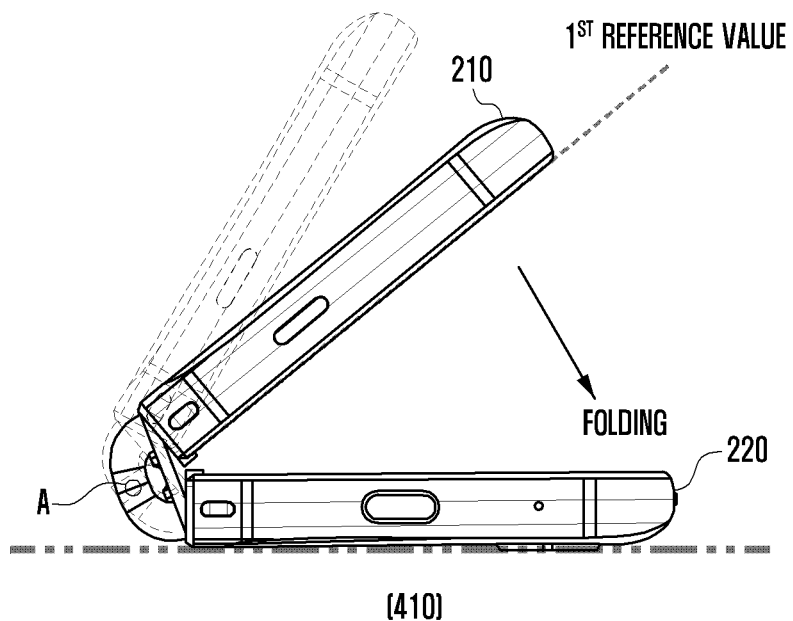
FIG. 4A is a view illustrating an example of setting a first reference value and a second reference value in a foldable electronic device according to various embodiments.
Figure 4A:
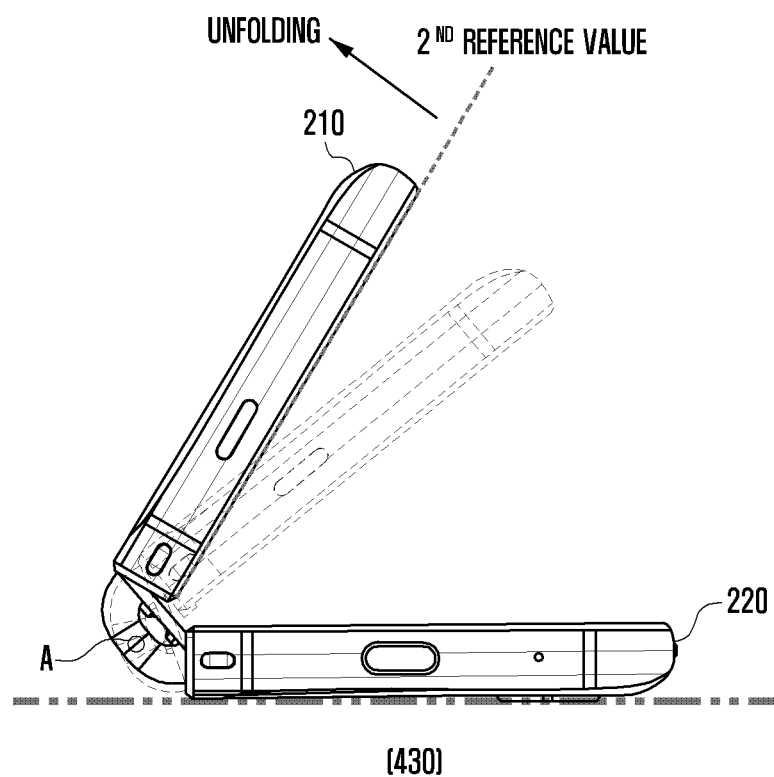

FIG. 4A is a view illustrating an example of setting a first reference value and a second reference value in a foldable electronic device according to various embodiments.

Referring to FIG. 4A, a foldable electronic device (e.g., the electronic device 101 of FIG. 1) according to various embodiments may include a first housing (e.g., the first housing 210 of FIGS. 2A to 2C) and a second housing (e.g., the second housing 220 of FIGS. 2A to 2C) designed to be folded relative to each other with reference to a folding axis (e.g., axis A). When the folding angle between the first housing 210 and the second housing 220 satisfies a set condition, the processor (e.g., the first processor 120 in FIG. 1) can set the first reference value based on the magnetic force value acquired from the digital Hall sensor (e.g., the digital Hall sensor 280 in FIGS. 2A and 2C) and a first reference set value, and can set the second reference value based on the set first reference value and a second reference set value. As described herein, the set condition can include, for example, maintaining the folding angle at set angle (e.g., a target angel of about 10 degrees or less) for a predetermined period of time (e.g., from about 1 second to about 3 seconds).

The first reference value is a threshold set in the digital Hall sensor 280 to determine the folding (410) of the electronic device 101 and can refer to a BOP. The second reference value is a threshold set in the digital Hall sensor 280 to determine the unfolding (430) of the electronic device 101 and can refer to a BRP. When the measured magnetic force value is equal to or greater than the first reference value, the digital Hall sensor 280 can output (or transmit) a first interrupt signal (e.g., "interrupt high") to the processor 120. When receiving the first interrupt signal from the digital Hall sensor 280, the processor 120 can determine that the electronic device 101 is in the folded state (410), and may control the operation of the electronic device 101 in response to the folded state of the electronic device 101. When the measured magnetic force value is equal to or smaller than the second reference value, the digital Hall sensor 280 can output (or transmit) a second interrupt signal (e.g., "interrupt low") to the processor 120. When receiving the second interrupt signal from the digital Hall sensor 280, the processor 120 can determine that the electronic device 101 is in the unfolded state (430), and can control the operation of the electronic device 101 in response to the unfolded state of the electronic device 101.

Figure 4B:
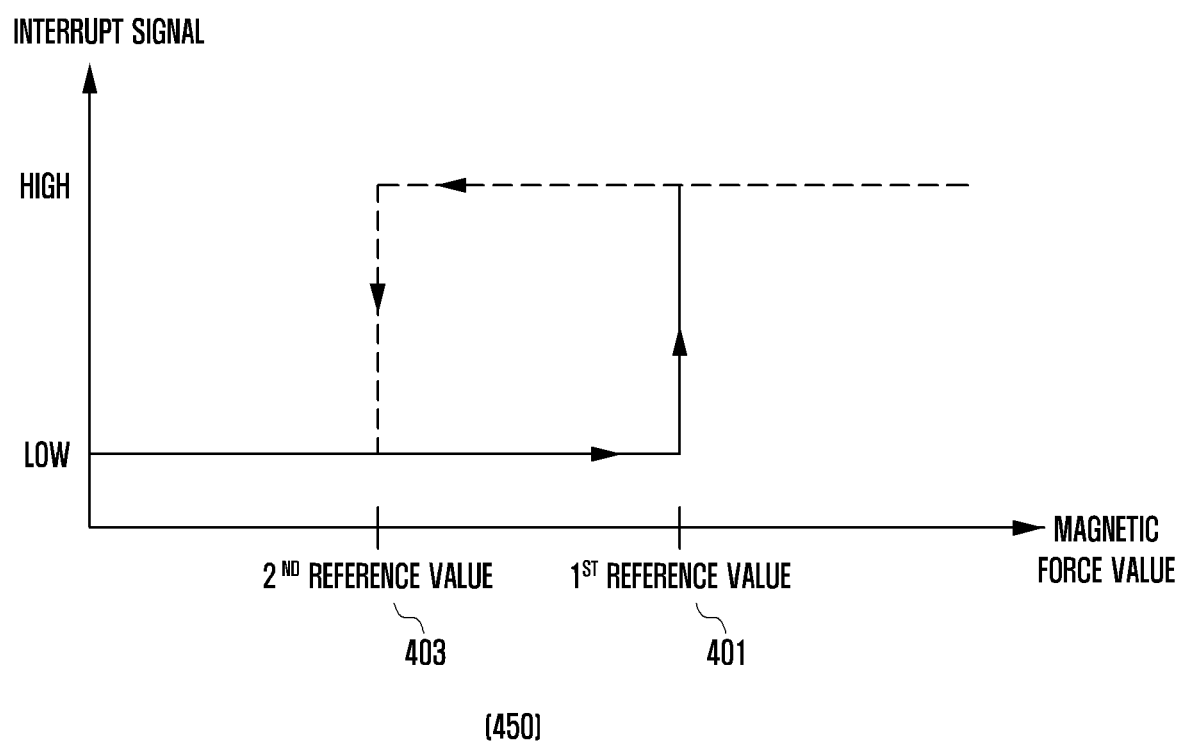
FIG. 4B is a view illustrating a graph representing a first reference value and a second reference value according to various embodiments of the disclosure.

FIG. 4B is a view illustrating a graph representing a first reference value and a second reference value according to various embodiments.

Referring to FIG. 4B, the processor 120 may determine an interrupt signal for determining folding or unfolding of the electronic device 101 as "low" or "high" based on the magnetic force value measured by the digital Hall sensor 280. Referring to the graph 450, when the first interrupt signal generated in response to the first reference value 401 is "interrupt high", the second interrupt signal generated in response to the second reference value 403 may be determined as "interrupt low". Conversely, when the first interrupt signal is "interrupt low", the second interrupt signal may be determined as "interrupt high". For example, it may vary depending on whether the electronic device 101 is determined to be folded when the interrupt is high or whether the electronic device 101 is determined to be folded when the interrupt is low.

FIG. 5A is a view illustrating a table 510 showing magnetic force values corresponding to folding angles of a foldable electronic device according to various embodiments.

Referring to FIG. 5A, table (510) can be stored in a memory (e.g., memory 130) of a foldable electronic device (e.g., the electronic device 101 in FIG. 1). As described herein, various embodiments of the foldable electronic device 101 can include a first housing (e.g., the first housing 210 in FIGS. 2A to 2C) and a second housing (e.g., the second housing 220 in FIGS. 2A to 2C) which can be folded relative to each other with reference to a folding axis (e.g., axis A). The electronic device 101 can include a first sensor module (e.g., the sensor module 176 in FIG. 1) (the first sensor module 270) in the first housing 210 and a second sensor module (e.g., the sensor module 176 in FIG. 1) (the second sensor module 275) in the second housing 220. The electronic device 101 can calculate the angle (or the folding angle) between the first housing 210 and the second housing 220 by using the first sensor module 270 and the second sensor module 275, and can acquire a measured magnetic force value from a digital Hall sensor (e.g., the digital Hall sensor 280 in FIGS. 2A and 2C).

According to various embodiments, the magnetic force value measured by the digital Hall sensor 280 may be changed depending on the angle between the first housing 210 and the second housing 220. The digital Hall sensor 280 may measure magnetic force values corresponding to the x axis 501, the y axis 503, and the z axis 505. Table 510 shows magnetic force values of the x axis 501, the y axis 503, and the z axis 505 corresponding to folding angles (e.g., 0 degrees to 180 degrees) between the first housing 210 and the second housing 220.

According to a non-limiting embodiment of the disclosure, when the angle between the first housing 210 and the second housing 220 is 10 degrees or less, the electronic device 101 may determine it as the folded state, and when the angle between the first housing 210 and the second housing 220 is 20 degrees or more, the electronic device 101 may determine it as an unfolded state. Referring to Table 510, the electronic device 101 may set a magnetic force value (e.g., −362) of the y axis 503 corresponding to an angle of 10 degrees as the first reference value, and a magnetic force value (e.g., −431) of the y-axis corresponding to an angle of 20 degrees as the second reference value. When the difference between the first reference value (e.g. 10 degrees) and the second reference value (e.g., 20 degrees) is a value (e.g., 70 uT) close to the earth's magnetic field (e.g., 40 uT to 60 uT), an error may occur in determining the folded state of the electronic device 101 due to the earth's magnetic field.

According to a non-limiting embodiment of the disclosure, the electronic device 101 can set a first reference set value (e.g., 100 uT) or a second reference set value (e.g., 100 uT), and with reference to 0 degrees, the electronic device 101 can set a value less than the magnetic force value of 0 degrees (e.g., −308) by the first reference set value as the first reference value (e.g., −408) and may set a value less than the first reference value by the second reference set value may be set as the second reference value (e.g., −508). When the first reference value (e.g., −408) and the second reference value (e.g., −508) are set, at an angle of 15 degrees with reference to Table 510, the electronic device 101 can determine that the electronic device 101 is in the folded state, and at an angle of 25 degrees, the electronic device 101 can determine that the electronic device 101 is in the unfolded state. According to the change of the first reference value and the second reference value, the angle determined as the folded state or the unfolded state may be changed.

Figure 5B:
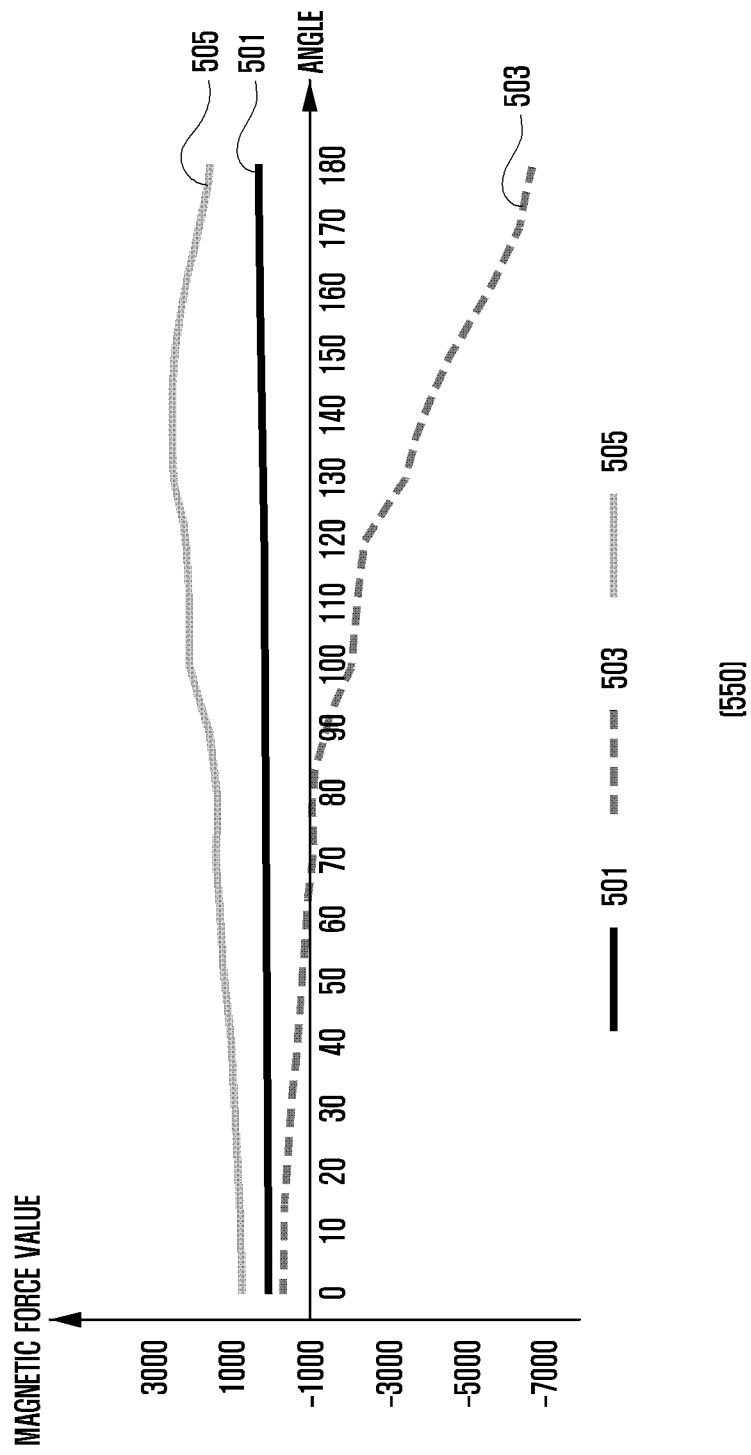
FIG. 5B is a view illustrating a graph showing magnetic force values according to angles of a foldable electronic device according to various embodiments.

FIG. 5B is a view illustrating a graph 550 showing magnetic force values according angles of a foldable electronic device according to various embodiments.

Referring to FIG. 5B, the numerical values in Table 510 representing magnetic force values according angles may be represented as Graph 550 representing angles and magnetic force values. Referring to an embodiment illustrated in FIG. 5B, Graph 550 illustrates that the magnetic force change corresponding to the y axis 503 may be the greatest among the magnetic force changes corresponding to the x axis 501, the y axis 503, and the z axis 505. Since the first reference value and the second reference value may be set for each axis, the first reference value and the second reference value may be set with reference to the y axis 503 in which the largest magnetic force difference occurs depending on the angle of the electronic device 101. For example, an axis on which the first reference value and the second reference value are set may be determined based on the arrangement structure of the magnet 285 and the digital Hall sensor 280, which are arranged for the magnetic force measurement by the digital Hall sensor 280.

According to various embodiments, the processor 120 may include a software module that calculates an angle with reference sensing values measured by the first sensor module 270 and the second sensor module 275 and a software module that matches the angles with the magnetic force values to prepare Table 510 separately or integratedly.

Figure 6:
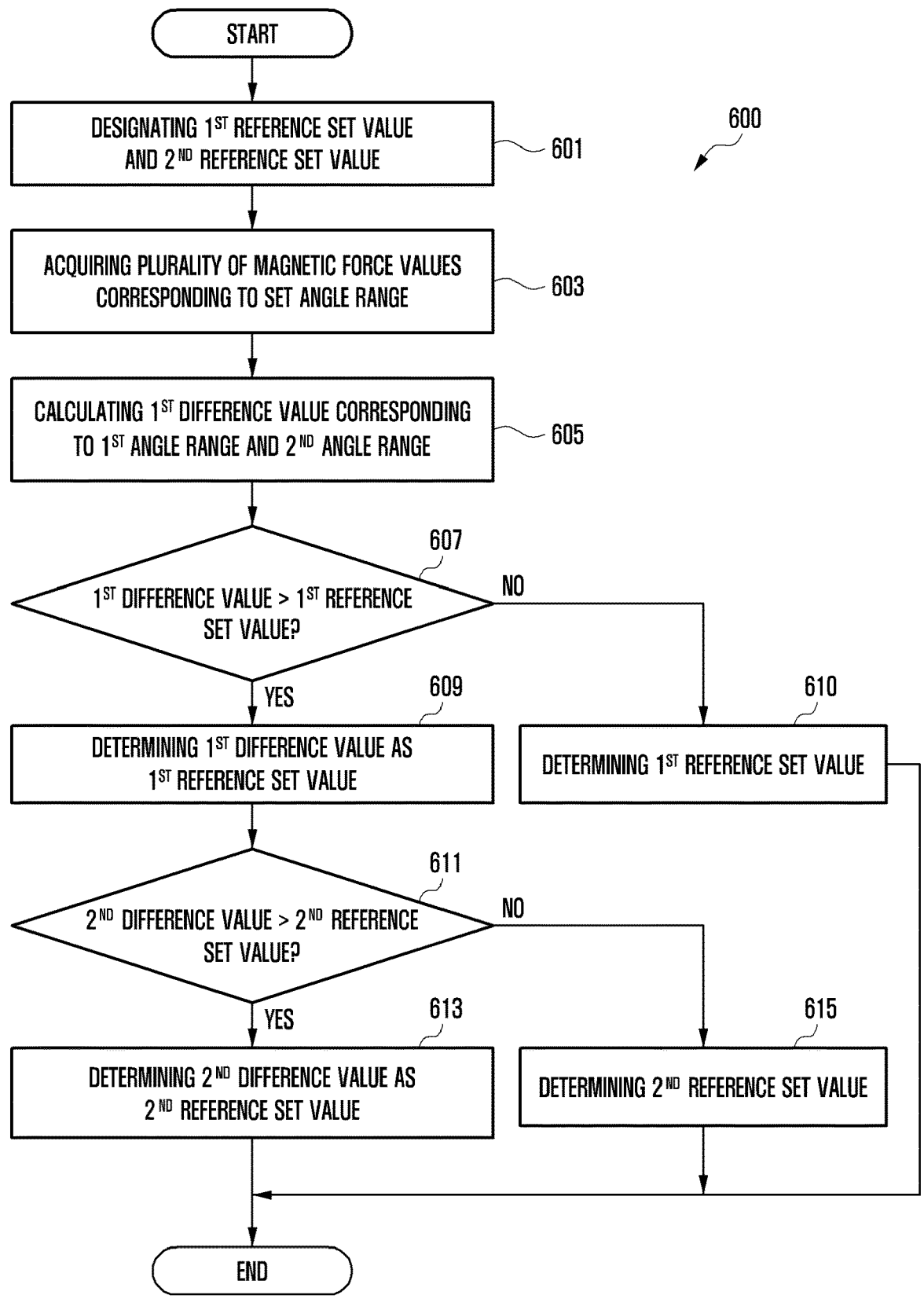
FIG. 6 is a flowchart illustrating a method of setting reference values of a digital Hall sensor included in a foldable electronic device according to various embodiments.

FIG. 6 is a flowchart (600) illustrating a method of setting reference values of a digital Hall sensor included in a foldable electronic device according to various embodiments. According to an embodiment, the flowchart (600) illustrates in greater detail operation 305 shown in FIG. 3.

Referring to FIG. 6, in operation 601, the processor (e.g., the processor 120 in FIG. 1) of the foldable electronic device (e.g., the electronic device 101 of FIG. 1) according to various embodiments may designate a first reference set value BOP_delta and a second reference set value BRP_delta. The first reference set value may be a reference value associated with a first reference value, and the second reference set value may be a reference value associated with a second reference value. The first reference value is a threshold set in the digital Hall sensor (e.g., the digital Hall sensor 280 in FIGS. 2A and 2C) to determine the folding of the electronic device 101 and may mean a BOP. The second reference value is a threshold set in the digital Hall sensor 280 to determine the unfolding of the electronic device 101 and may mean a BRP. The first reference set value and the second reference set value may be set within a range that is not affected by the earth's magnetic field. For example, the first reference set value and the second reference set value may be the same value (e.g., 100 uT). The first reference set value and the second reference set value may be stored in a memory (e.g., the memory 130 in FIG. 1). The processor 120 may read the first reference set value and the second reference set value from the memory 130.

According to various embodiments, the processor 120 may designate a first reference set value and a second reference set value based on a value measured by the digital Hall sensor 280 included in the electronic device 101. Since a deviation may exist for each electronic device 101, the folding or unfolding of the electronic device 101 may or may not be recognized based on the first reference set value and the second reference set value. The processor 120 may set the first reference value and the second reference value through an operation of folding and unfolding the electronic device 101 at least once. Each electronic device may recognize the folding or unfolding of the electronic device 101 by setting a first reference value and a second reference value suitable for the electronic device 101.

In operation 603, the processor 120 may acquire a plurality of magnetic force values corresponding to a set angle range. The electronic device 101 may include a first housing (e.g., the first housing 210 in FIGS. 2A to 2C) and a second housing (e.g., the second housing 220 in FIGS. 2A to 2C) designed to be folded relative to each other with reference to the folding axis (e.g., axis A). The processor 120 may acquire a plurality of magnetic force values corresponding to the angles between the first housing 210 and the second housing 220. The processor 120 may acquire the plurality of magnetic force values within an angle range (e.g., within 0 degrees to 50 degrees) in which it is easy to recognize the folding or unfolding of the electronic device 101. For example, the processor 120 may acquire a first magnetic force value at an angle of 0 degrees between the first housing 210 and the second housing 220, a second magnetic force value at 10 degrees, and a third magnetic force value at 20 degrees. According to an embodiment of the disclosure, the processor 120 may acquire a first magnetic force value at an angle of 10 degrees between the first housing 210 and the second housing 220, a second magnetic force value at 20 degrees, and a third magnetic force value at 30 degrees. These examples are only for helping the understanding of the disclosure, and the disclosure is not limited by the examples.

In operation 605, the processor 120 may calculate a first difference value corresponding to a first angle range and a second difference value corresponding to a second angle range. The first angle range may range from 0 degrees to 10 degrees, and the second angle range may range from 10 degrees to 20 degrees. The processor 120 may calculate the first difference value by subtracting the first magnetic force value H1 from the second magnetic force value H2 (D1=H2−H1). The processor 120 may calculate the second difference value by subtracting the second magnetic force value from the third magnetic force value (D2=H3−H2).

In operation 607, the processor 120 may determine whether or not the first difference value exceeds the first reference set value BOP_delta. Since the first reference set value is set within a range in which the first reference value is not affected by the earth's magnetic field, the first difference value may be greater than the first reference set value. When the first difference value D1 exceeds the first reference set value BOP_delta (D1>BOP_delta), the processor 120 may perform operation 609, and when the first difference value is equal to or smaller than the first reference set value (D1≤BOP_delta), the processor 120 may perform operation 610.

When, at operation 607, the first difference value is equal to or smaller than the first reference set value (D1≤BOP_delta), the method proceeds to operation 610 and the processor 120 may set (or determine) the first reference set value as the first reference set value. That is, the processor 120 may determine the first reference set value designated in operation 601 as the first reference set value as it is. The processor 120 may store the set first reference set value in a non-volatile memory (e.g., the non-volatile memory 134 of FIG. 1).

When, at operation 607, the first difference value exceeds the first reference set value (D1>BOP_delta), the method proceeds to operation 609 and the processor 120 may set the first difference value as the first reference set value. When the first difference value is greater than the first reference set value, the processor 120 may set a greater value as the first reference set value. The processor 120 may store the set first reference set value BOP_delta in the first nonvolatile memory 134.

In operation 611, the processor 120 may determine whether or not the second difference value D2 exceeds the second reference set value BRP_delta. Since the set reference set value is set within a range in which the second reference value is not affected by the earth's magnetic field, the second difference value may be greater than the second reference set value. When the second difference value exceeds the second reference set value (D2>BRP_delta), the processor 120 may perform operation 613, and when the second difference value is equal to or smaller than the second reference set value (D2≤BRP_delta), the processor 120 may perform operation 615.

When, at operation 611, the second difference value is equal to or smaller than the second reference set value (D2≤BRP_delta), the method proceeds to operation 615 and the processor 120 may set (or determine) the second reference set value as the second reference set value. That is, the processor 120 may determine the second reference set value designated in operation 601 as the second reference set value as it is. The processor 120 may store the set second reference set value in the nonvolatile memory 134.

When, at operation 611, the second difference value exceeds the second reference set value (D2>BRP_delta), the method proceeds to operation 613 and the processor 120 may set (or determine) the second difference value as the second reference set value. When the second difference value is greater than the second reference set value, the processor 120 may set a greater value as the second reference set value. The processor 120 may store the set second reference set value BOP_delta in the nonvolatile memory 134.

FIG. 7A is a view illustrating a table (700) showing magnetic force values according to angles of a foldable electronic device according to various embodiments.

Referring to FIG. 7A, Table (510) can be stored in a memory (e.g., memory 130) of a foldable electronic device (e.g., the electronic device 101 in FIG. 1). As described herein, various embodiments of the foldable electronic device 101 can include a first housing (e.g., the first housing 210 in FIGS. 2A to 2C) and a second housing (e.g., the second housing 220 in FIGS. 2A to 2C) which can be folded relative to each other with reference to a folding axis (e.g., axis A). The electronic device 101 may include a first sensor module (e.g., the sensor module 176 in FIG. 1) (the first sensor module 270) in the first housing 210 and a second sensor module (e.g., the sensor module 176 in FIG. 1) (the second sensor module 275) in the second housing 220. The electronic device 101 may calculate the angle (or the folding angle) between the first housing 210 and the second housing 220 by using the first sensor module 270 and the second sensor module 275, and can acquire a measured magnetic force value from a digital Hall sensor (e.g., the digital Hall sensor 280 in FIGS. 2A and 2C).

According to various embodiments, the magnetic force value measured by the digital Hall sensor 280 may be changed depending on the angle between the first housing 210 and the second housing 220. The digital Hall sensor 280 may measure magnetic force values corresponding to the x axis 701, the y axis 703, and the z axis 705. Table 710 shows magnetic force values of the x axis 701, the y axis 703, and the z axis 705 corresponding to folding angles (e.g., 0 degrees to 180 degrees) between the first housing 210 and the second housing 220. Table 710 may represent a case in which a magnetic force difference corresponding to 10 degrees (e.g., 0 degrees to 10 degrees or 10 degrees to 20 degrees) is 100 uT or more.

For example, when the angle between the first housing 210 and the second housing 220 is 10 degrees or less, the electronic device 101 may determine it as the folded state, and when the angle between the first housing 210 and the second housing 220 is 20 degrees or more, the electronic device 101 may determine it as an unfolded state. Referring to Table 710, the electronic device 101 may acquire a first magnetic force value (e.g., −107) of the y axis 703 corresponding to an angle of 0 degrees, may acquire a second magnetic force value (e.g., −275) of the y-axis 703 corresponding to an angle of 10 degrees, and may acquire a third magnetic force value (e.g., −471) of the y axis 703 corresponding to an angle of 20 degrees. When the first difference value (−168) between the second magnetic force value and the first magnetic force value exceeds the first reference set value (e.g., 100 uT), the electronic device 101 may set the first difference value (−168) as the first reference set value. When the second difference value (−196) between the third magnetic force value and the second magnetic force value exceeds the second reference set value (e.g., 100 uT), the electronic device 101 may set the second difference value (−196) as the second reference set value.

Figure 7B:
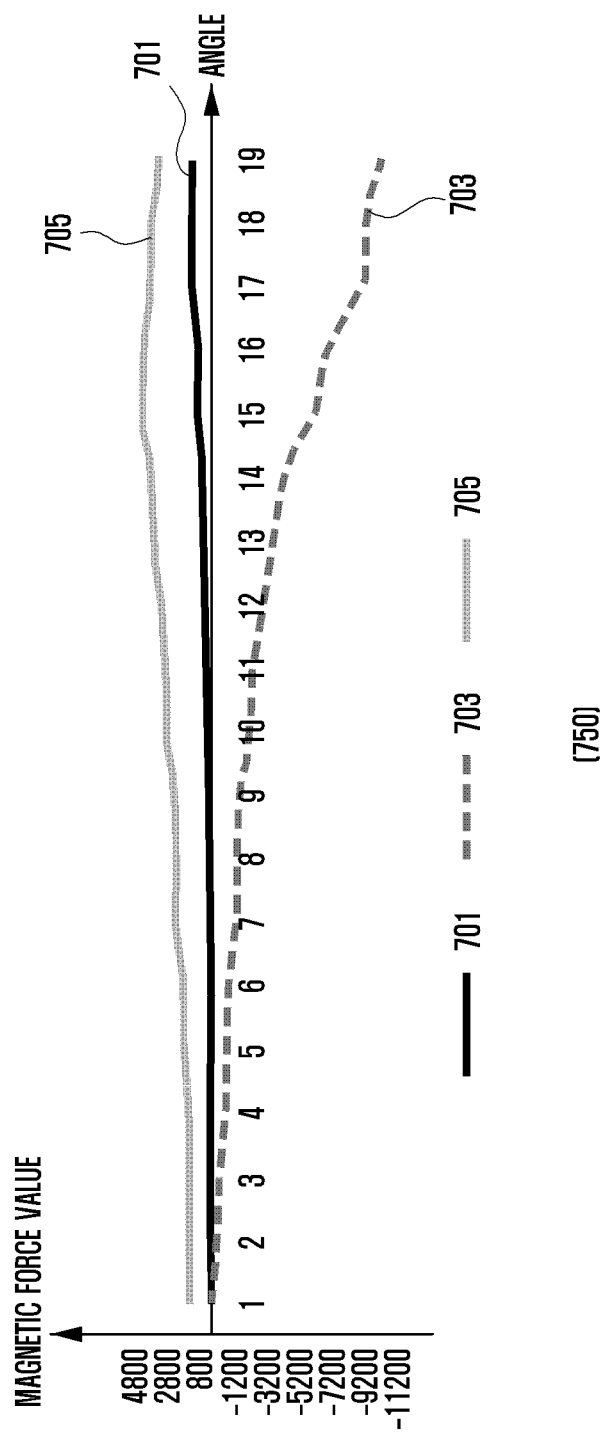
FIG. 7B is a view illustrating a graph showing magnetic force values according to angles of a foldable electronic device according to various embodiments.

FIG. 7B is a view illustrating a graph 750 showing magnetic force values according to angles of a foldable electronic device according to various embodiments.

Referring to an embodiment illustrated in FIG. 7B, Graph 750 represents an example in which a magnetic force difference corresponding to 10 degrees (e.g., 0 degrees to 10 degrees or 10 degrees to 20 degrees) is 100 uT or more. The numerical values in Table 710 representing magnetic force values according angles may be represented as Graph 750 representing angles and magnetic force values. Referring to Graph 750, among the magnetic force changes corresponding to the x axis 701, the y axis 703, and the z axis 705, the magnetic force change corresponding to the y axis 703 may be the greatest. Since the first reference value and the second reference value may be set for each axis, the first reference value and the second reference value may be set with reference to the y axis 703 in which the largest magnetic force difference occurs depending on the angle of the electronic device 101.

Figure 8:
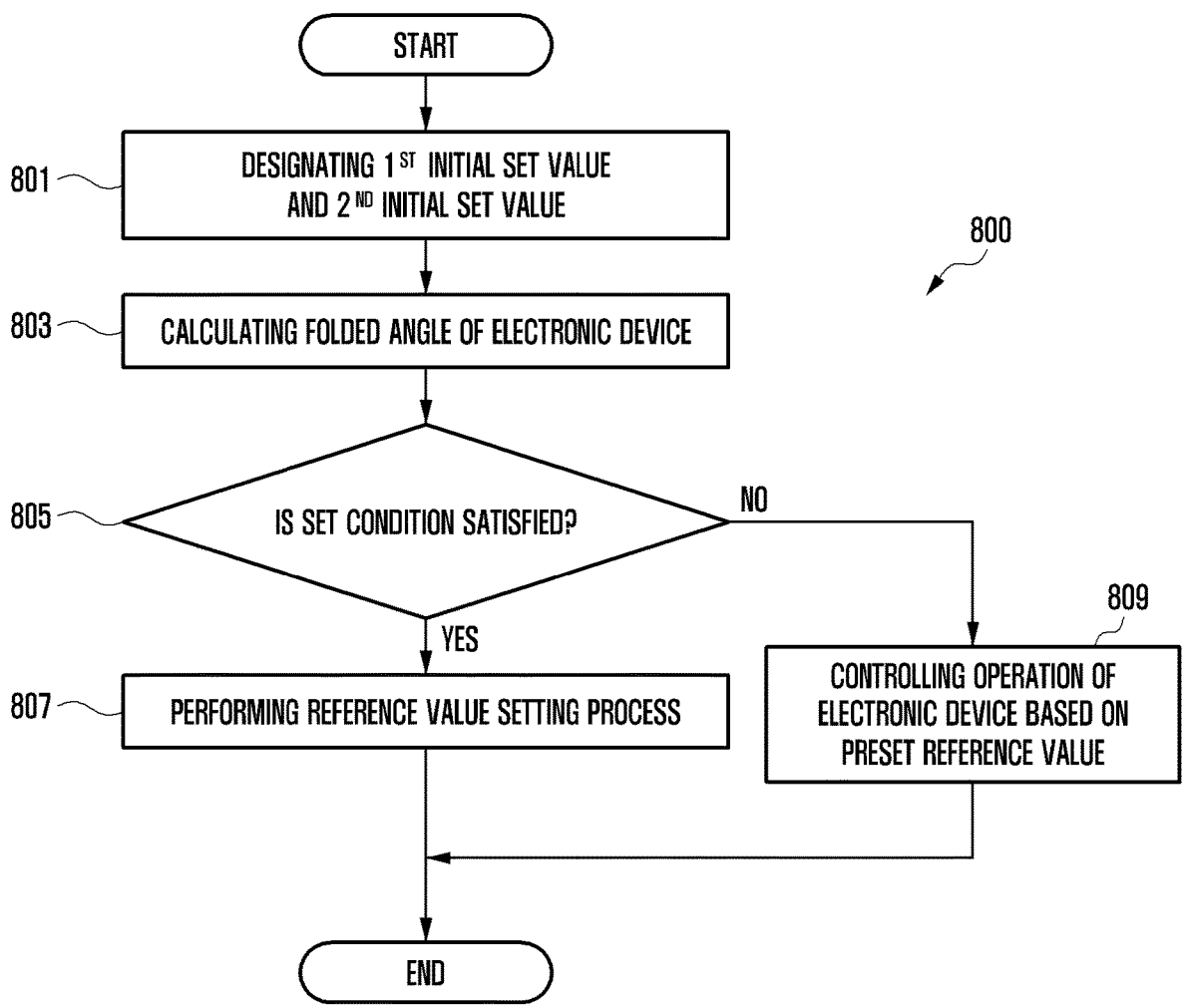
FIG. 8 is a flowchart illustrating a method of controlling an operation of a foldable electronic device according to a folding angle of the foldable electronic device according to various embodiments.

FIG. 8 is a flowchart (800) illustrating a method of controlling an operation of a foldable electronic device according to a folding angle of the foldable electronic device according to various embodiments.

Referring to FIG. 8, in operation 801, the processor (e.g., the processor 120 in FIG. 1) of the foldable electronic device (e.g., the electronic device 101 in FIG. 1) according to various embodiments may designate a first initial set value and a second initial set value. The electronic device 101 may include a first housing (e.g., the first housing 210 in FIGS. 2A to 2C) and a second housing (e.g., the second housing 220 in FIGS. 2A to 2C) designed to be folded relative to each other with reference to the folding axis (e.g., axis A). The electronic device 101 may include a first sensor module (e.g., the sensor module 176 in FIG. 1) (the first sensor module 270) in the first housing 210 and a second sensor module (e.g., the sensor module 176 in FIG. 1) (the second sensor module 275) in the second housing 220. A deviation may occur in the first sensor module 270 or the second sensor module 275 for each electronic device 101. Accordingly, the initial set value associated with reference value setting may be designated as an appropriate value through a distribution in the electronic device 101. For example, the processor 120 may designate a first initial set value INIT_BOP associated with the first reference value BOP and a second initial set value ININ_BRP associated with the second reference value BRP.

In operation 803, the processor 120 may calculate the folding angle of the electronic device 101. For example, the processor 120 may calculate the angle (or the folding angle) between the first housing 210 and the second housing 220 by using the first sensor module 270 and the second sensor module 275.

In operation 805, the processor 120 may determine whether or not the folding state of the electronic device 101 corresponds to (or satisfies) a set condition. The set condition may include that the folding angle corresponds to a set angle (e.g., 10 degrees or less) and is maintained at the set angle for a predetermined period of time (e.g., 1 second, or 2 seconds, or 3 seconds, etc.). When the folding state of the electronic device 101 satisfies the set condition at operation 805, the processor 120 may perform operation 807. When, however, the folding state of the electronic device 101 does not satisfy the set condition at operation 805, the processor 120 may perform operation 809.

When the folding state of the electronic device 101 satisfies the set condition at operation 805, in the method proceeds to operation 807 and the processor 120 may perform a reference value setting process.

According to an embodiment, the processor 120 may acquire a magnetic force value from a digital Hall sensor (e.g., the digital Hall sensor 280 in FIGS. 2A and 2C) based on a set condition according to the folding angle. For example, the reference value setting process may include an operation of setting the first reference value BOP based on the magnetic force value H acquired from the digital Hall sensor 280 at the time point at which the set condition is satisfied and a first reference set value (e.g., BOP_delta) and an operation of setting the second reference value BRP based on the set first reference value BOP and a second reference set value BRP_delta. For example, the processor 120 may set the first reference value by subtracting the first reference set value from the magnetic force value H (e.g., BOP=H−BOP_delta) and may set the second reference value by subtracting the second value from the first reference value (e.g., BRP=BOP−BRP_delta).

According to various embodiments, the processor 120 may perform the reference value setting process whenever the folding state of the electronic device 101 satisfies the set condition. The first reference set value and the second reference set value may be stored in a memory (e.g., the memory 130 in FIG. 1) through an operation corresponding to FIG. 6. The processor 120 may read the first reference set value and the second reference set value stored in the memory 130 to perform the reference value setting process.

When the folding state of the electronic device 101 does not satisfy the set condition at operation 805, the method proceeds to operation 809 and the processor 120 may control the operation of the electronic device 101 based on a preset reference value stored in a memory 130 of the processor 120. In one or more non-limiting embodiments, the preset reference value is indicative of a target folding angle between the first and second between the first housing 210 and second housing 220. The digital Hall sensor 280 may generate a first interrupt signal when the measured magnetic force value corresponds to the first reference value. The digital Hall sensor 280 may generate a second interrupt signal when the measured magnetic force value corresponds to the second reference value. The processor 120 may control the operation of the electronic device 101 based on the interrupt signal received from the digital Hall sensor 280. Operation 809 may include operations 307 and 309 of FIG. 3.

FIG. 9A is a view illustrating a table (910) showing magnetic force values corresponding to folding angles of a foldable electronic device according to various embodiments after magnetization in the foldable electronic device.

Referring to FIG. 9A, table (910) can be stored in a memory (e.g., memory 130) of a foldable electronic device (e.g., the electronic device 101 in FIG. 1). As described herein, various embodiments of the foldable electronic device 101 can include a first housing (e.g., the first housing 210 in FIGS. 2A to 2C) and a second housing (e.g., the second housing 220 in FIGS. 2A to 2C) which can be folded relative to each other with reference to a folding axis (e.g., axis A). The electronic device 101 may include a first sensor module (e.g., the sensor module 176 in FIG. 1) (the first sensor module 270) in the first housing 210 and a second sensor module (e.g., the sensor module 176 in FIG. 1) (the second sensor module 275) in the second housing 220. The electronic device 101 may calculate the angle (or the folding angle) between the first housing 210 and the second housing 220 by using the first sensor module 270 and the second sensor module 275, and can acquire a measured magnetic force value from a digital Hall sensor (e.g., the digital Hall sensor 280 in FIGS. 2A and 2C).

According to various embodiments, the magnetic force value measured by the digital Hall sensor 280 may be changed depending on the angle between the first housing 210 and the second housing 220. The digital Hall sensor 280 may measure magnetic force values corresponding to the x axis 901, the y axis 903, and the z axis 905. Table 910 shows magnetic force values of the x axis 901, the y axis 903, and the z axis 905 corresponding to folding angles (e.g., 0 degrees to 180 degrees) between the first housing 210 and the second housing 220. Table 910 shows an example in which the electronic device 101 is magnetized so that the magnetic force of the digital Hall sensor 280 is changed. With the magnetization, the electronic device 101 may be affected by a magnetic material (e.g., a magnet-attached mobile phone case, vehicle cradle, or the like), so that an offset may occur in the magnetic force value measured by the digital Hall sensor 280.

When the first reference value is set to −408 and the second reference value is set to −508, in a comparative example, since the reference value is not changed once the reference value is set, the digital Hall sensor 280 may not generate an interrupt signal when the measured magnetic force value (−512) does not correspond to the first reference value. That is, since the angle between the first housing 210 and the second housing 220 is 0 degrees, the digital Hall sensor 280 may not generate an interrupt signal even when the electronic device 101 is fully folded. When the interrupt signal is not generated, an error that causes the processor 120 to recognize that the electronic device 101 is still in the unfolded state or the intermediate state may occur.

Figure 9B:
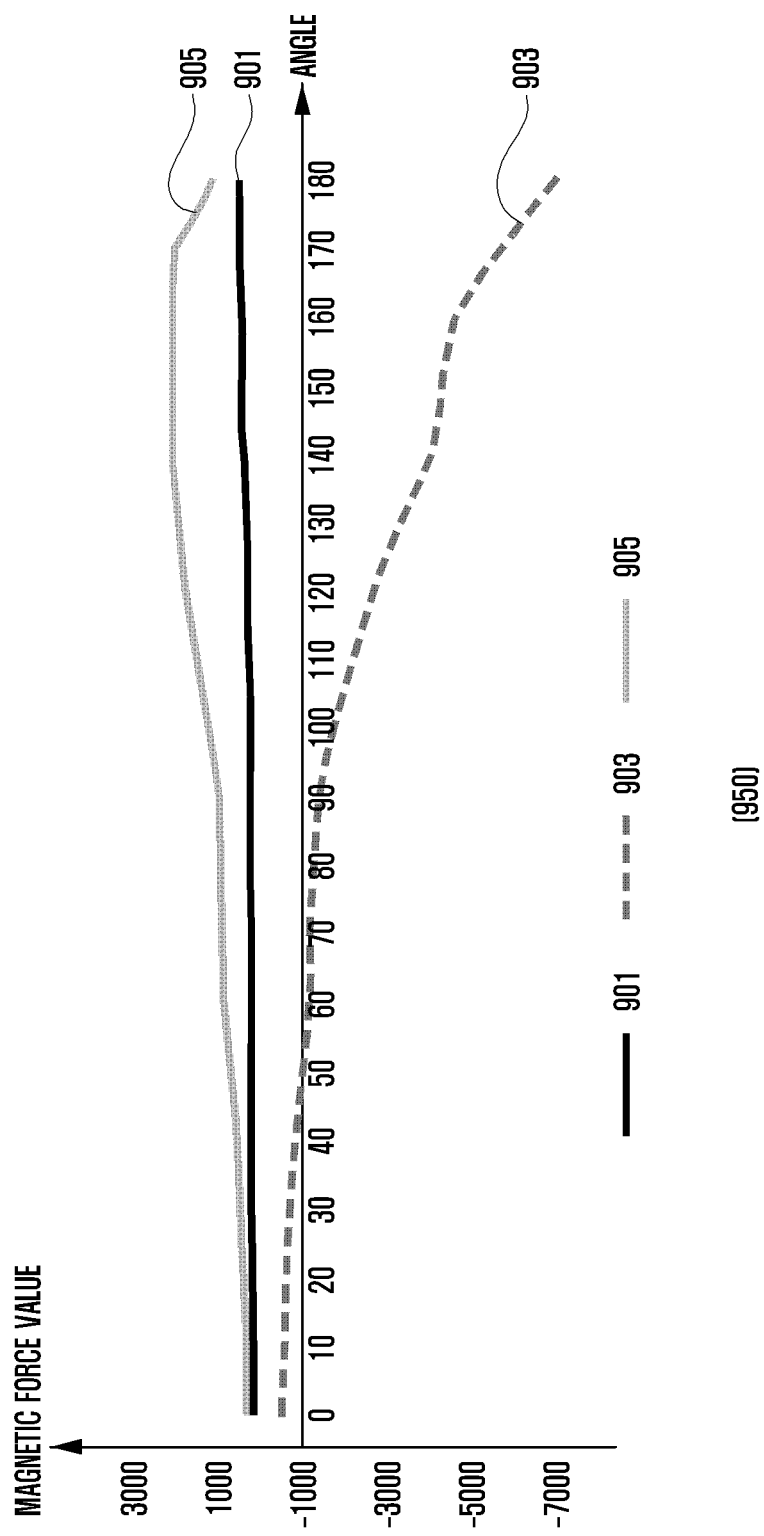
FIG. 9B is view illustrating a graph showing a change in the magnetic force values of a digital Hall sensor after magnetization in a foldable electronic device according to various embodiments.

FIG. 9B is view illustrating a graph 950 showing a change in the magnetic force values of a digital Hall sensor after magnetization in a foldable electronic device according to various embodiments.

Referring to FIG. 9B, the numerical values of the table 910 representing magnetic force values according to angles may be represented as graphs 950 representing angles and magnetic force values. According to an example, Graph 950 shows that a change occurs in magnetic force values corresponding to the x-axis 901, the y-axis 903, and the z-axis 905 of the digital Hall sensor 280 according to magnetization. An angle range in which it is easy to recognize the folding or unfolding of the electronic device 101 may be 0 degrees to 50 degrees. When a magnetic force pattern has a great magnetic force change between 0 degrees and 50 degrees (e.g., when the slope of Graph 950 is sharp), the change in a set magnetic force due to magnetization may be negligible. When the table before magnetization (e.g., Table 710 in FIG. 7A) and Table 910 after magnetization are compared, the effect of magnetization may not be negligible when the magnetic force pattern has a small magnetic force change between 0 degrees and 50 degrees.

Figure 10A:
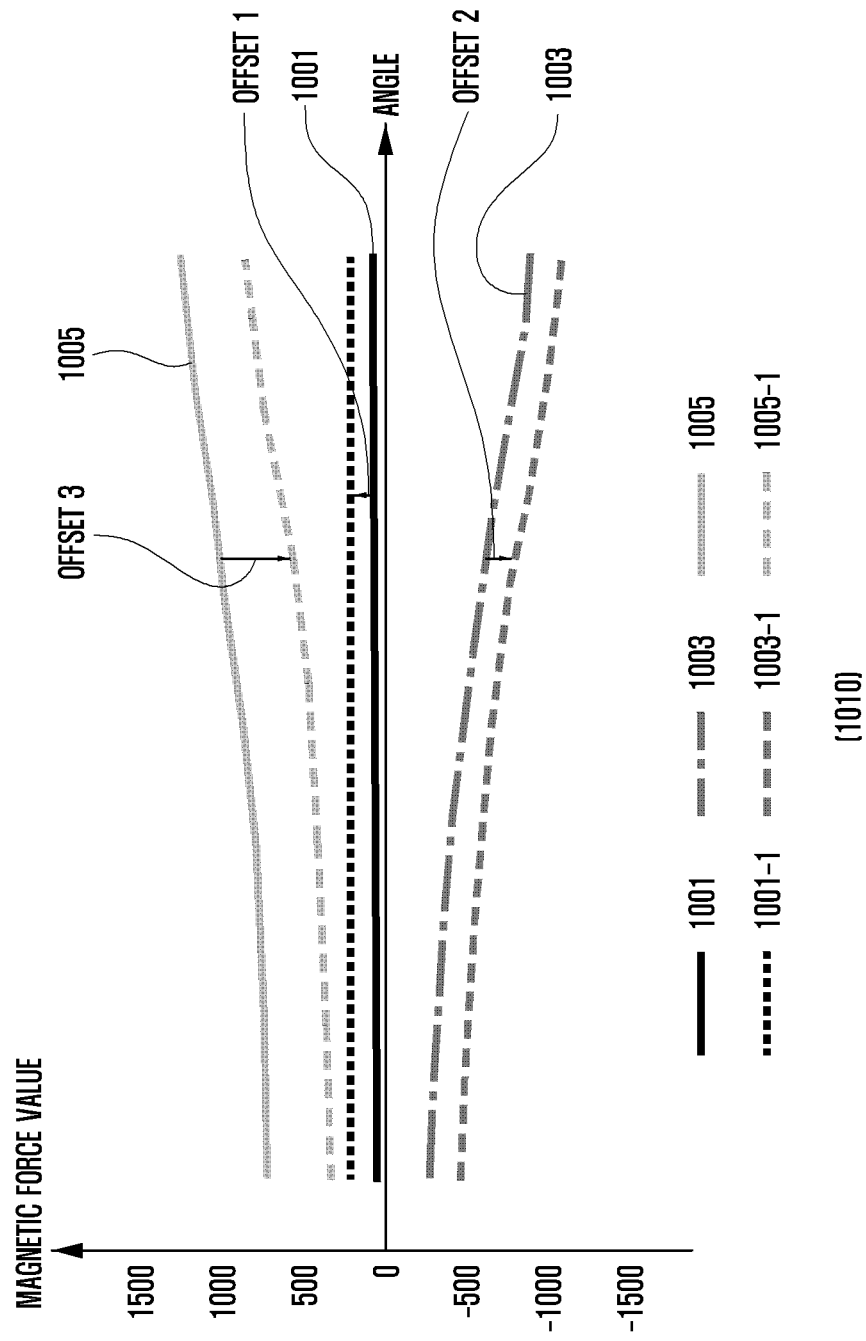
FIG. 10A is view illustrating a graph showing offsets generated in the magnetic force values of a digital Hall sensor after magnetization in a foldable electronic device according to various embodiments.

FIG. 10A is view illustrating a graph 1010 showing offsets generated in the magnetic force values of a digital Hall sensor 280 after magnetization in a foldable electronic device according to various embodiments.

Referring to FIG. 10A, when the foldable electronic device (e.g., the electronic device 101 of FIG. 1) according to various embodiments is magnetized, offsets may occur in the magnetic force values measured by the digital Hall sensor (e.g., the digital Hall sensor 280 in FIGS. 2A and 2C). For example, referring to Graph 1010, according to magnetization, a first offset (offset 1) may occur in the magnetic force value corresponding to the x-axis 1001 of the digital Hall sensor 280, a second offset (offset 2) may occur in the magnetic force value corresponding to the y-axis 1003, and a third offset (offset 3) may occur in the magnetic force value corresponding to the z-axis 1005.

Figure 10B:
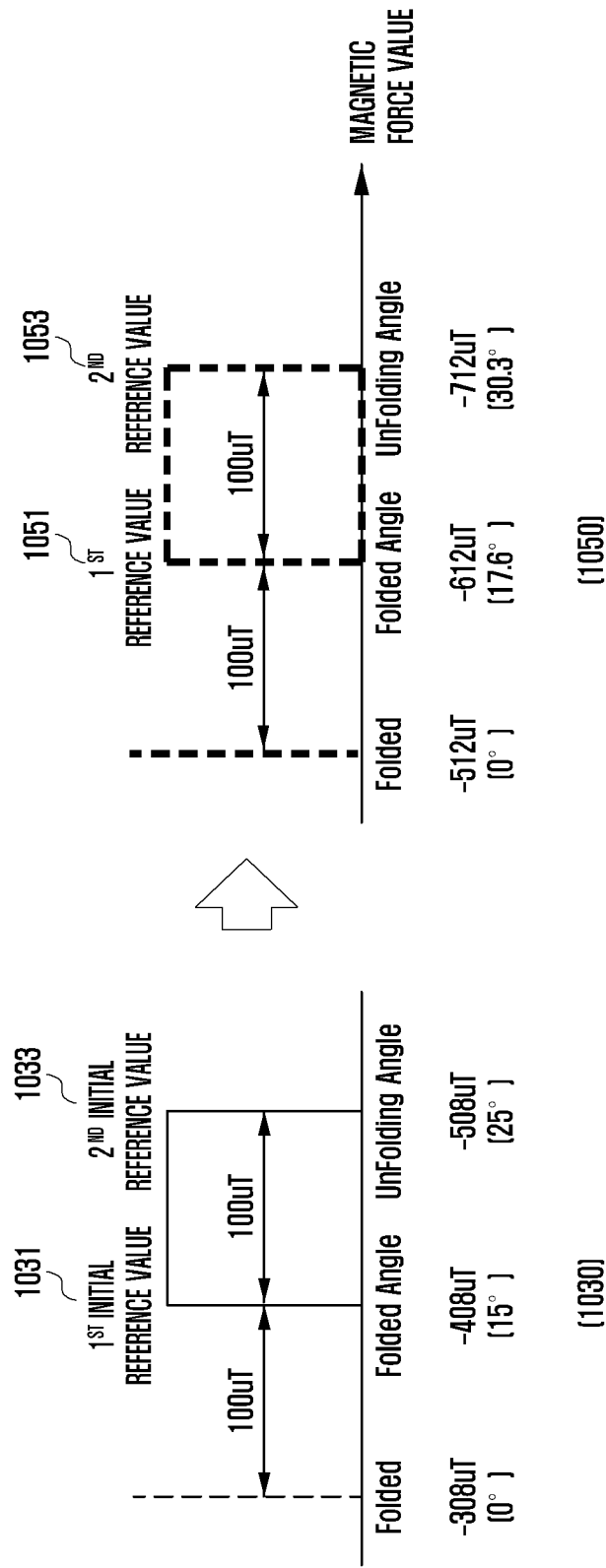
FIG. 10B is a view illustrating a change in reference values of a digital Hall sensor before and after magnetization in a foldable electronic device according to various embodiments.

FIG. 10B is a view illustrating a change in reference values of a digital Hall sensor before magnetization (e.g., a pre-magnetization state 1030) and after magnetization (e.g., magnetization state 1050) corresponding to a foldable electronic device 101 according to various embodiments.

Referring to FIG. 10B, in a pre-magnetization state 1030, the electronic device 101 may set −408 uT as a first initial reference value 1031 and −508 uT as a second initial reference value 1033. When the magnetic force value measured by the digital Hall sensor 280 is changed due to magnetization, in a post-magnetization state 1050, the electronic device 101 may set −612 uT as the first reference value 1051 and set −712 uT as the second reference value 1053.

According to an embodiment, the first initial reference value 1031 may be the first reference value set first, and the first reference value 1051 may be the first reference value set after the first initial reference value 1031 (e.g., the first reference value set for the second time). The second initial reference value 1033 may be the second reference value set first, and the second reference value 1053 may be the second reference value set after the second initial reference value 1033 (e.g., the second reference value set for the second time). When the set condition is satisfied, the electronic device 101 may change the first reference value 1051 and the second reference value 1053.

Figure 10C:
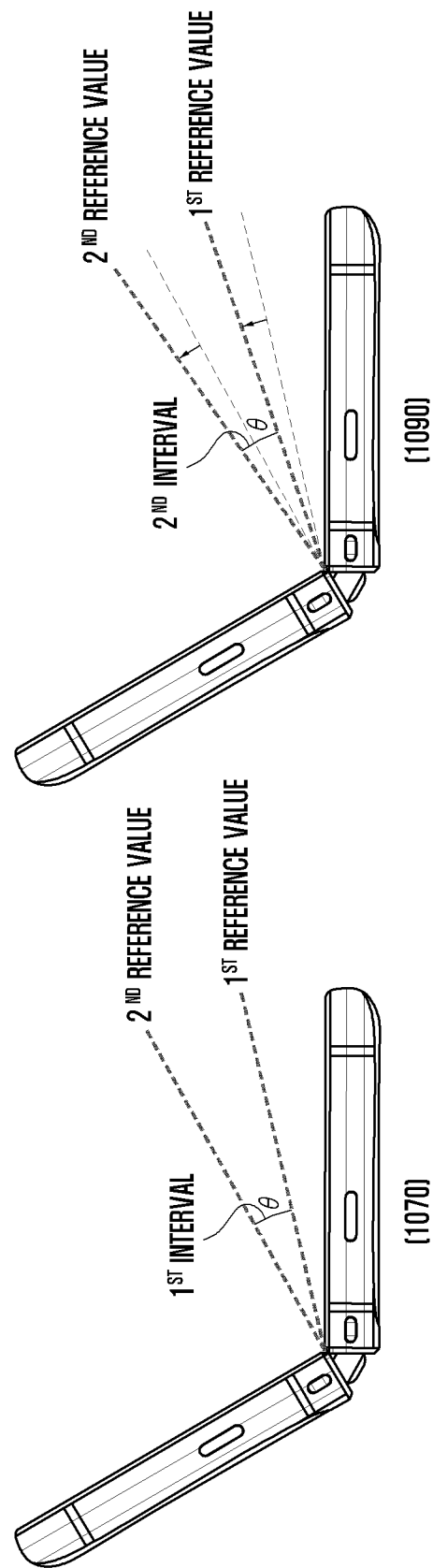
FIG. 10C is a view illustrating a change in reference values of a digital Hall sensor before and after magnetization in a foldable electronic device according to various embodiments.

FIG. 10C is a view illustrating a change in reference values of a digital Hall sensor 280 before magnetization (e.g., a pre-magnetization state 1070) and after magnetization (e.g., magnetization state 1090) corresponding to a foldable electronic device 101 according to various embodiments of the disclosure.

Referring to FIG. 10C, in the pre-magnetization state 1070, the first reference value (e.g., the first initial reference value 1031) and the second reference value (e.g., the second initial reference value 1033) may differ from each other by a first interval θ. In the post-magnetization state 1090, the first reference value (e.g., the first reference value 1051) and the second reference value (e.g., the second reference value 1053) may differ from each other by a second interval θ'. In the post-magnetization state 1090, since an offset has occurred in the magnetic force value, the first interval θ may be greater or smaller than the second interval θ'. When the folding angle is 15 degrees based on the first initial reference value 1031 in the pre-magnetization state 1070, the digital Hall sensor 280 may generate a first interrupt signal, and when the folding angle is 25 degrees based on the second initial reference value 1033, the digital Hall sensor 280 may generate a second interrupt signal. Thereafter, in the case in which the reference values are changed, when the folding angle is 17.6 degrees based on the changed first reference value 1051 in the post-magnetization state 1090, the digital Hall sensor 280 may generate a first interrupt signal, and when the folding angle is 30.3 degrees based on the second reference value 1053, the digital Hall sensor 280 may generate a second interrupt signal. According to the change of the first reference value and the second reference value, the angle determined as the folded state or the unfolded state may be changed.

Figure 11:
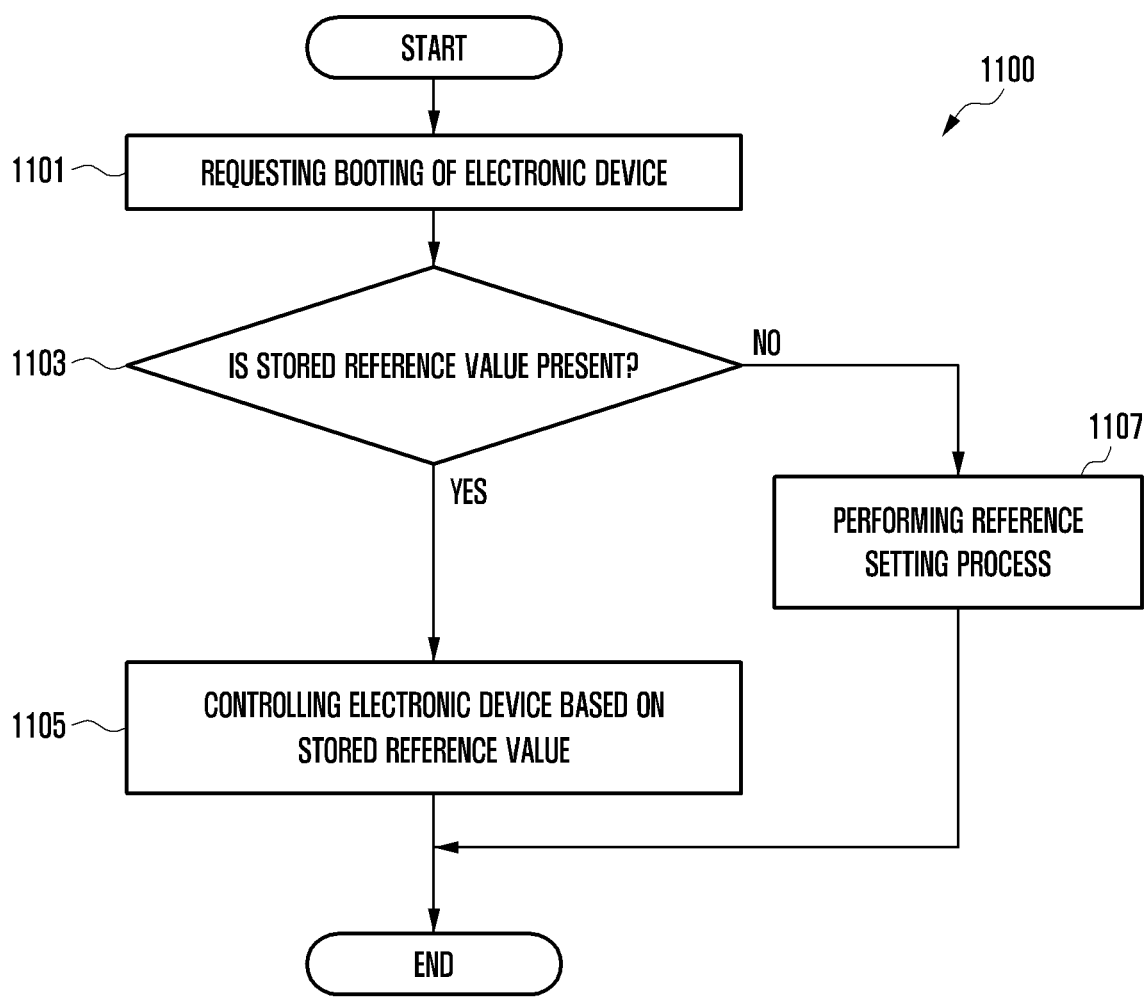
FIG. 11 is a flowchart illustrating a booting process related to a reference value of a digital Hall sensor in a foldable electronic device according to various embodiments.

FIG. 11 is a flowchart 1100 illustrating a booting process related to a reference value of a digital Hall sensor 280 in a foldable electronic device 101 according to various embodiments.

Referring to FIG. 11, in operation 1101, a processor (e.g., the processor 120 in FIG. 1) of a foldable electronic device (e.g., the electronic device 101 in FIG. 1) according to various embodiments may receive a request to boot the electronic device 101. Booting of the electronic device 101 refers to starting up the electronic device 101, and may be an operation for loading an operating system into a system by using a bootable device (a hard disk) in preparation for operation such that the electronic device 101 is able to operate. In other words, booting of the electronic device 101 may be to start up the system of the electronic device 101 or to initially set the system. The processor 120 may turn off and then turn on the power of the electronic device 101 according to a user's request, or may boot the electronic device 101 after updating an operating system. Although various operations are performed during the booting, only the reference values set in the digital Hall sensor (e.g., the digital Hall sensor 280 in FIGS. 2A and 2C) will be described below. The disclosure is not limited by this description.

In operation 1103, the processor 120 may determine whether or not a stored reference value exists. When the first reference value and the second reference value are set (or changed), the reference values may be stored in a nonvolatile memory (e.g., the non-volatile memory 134 in FIG. 1). The first reference value is a threshold set in the digital Hall sensor 280 to determine the folding of the electronic device 101 and may mean a BOP. The second reference value is a threshold set in the digital Hall sensor 280 to determine the unfolding of the electronic device 101 and may mean a BRP. The processor 120 may determine whether or not the first reference value and the second reference value are stored in the nonvolatile memory 134. When the stored reference values exist, the processor 120 may perform operation 1105 and when the stored reference values do not exist, the processor 120 may perform operation 1107.

When the stored reference values exist, in operation 1105, the method proceeds to operation 1105 and the processor 120 may control the operation of the electronic device 101 based on the stored reference values. A deviation may exist in a measurement value of the digital Hall sensor 280 included in the electronic device 101 for each electronic device 101. When the first reference value and the second reference value are stored in the nonvolatile memory 134, the first and second reference values may those set as reference values suitable (or appropriate) for the electronic device 101. The digital Hall sensor 280 may generate a first interrupt signal when the measured magnetic force value corresponds to the first reference value. The digital Hall sensor 280 may generate a second interrupt signal when the measured magnetic force value corresponds to the second reference value. When receiving the first interrupt signal from the digital Hall sensor 280, the processor 120 may determine that the electronic device 101 is in the folded state, and may control the operation of the electronic device 101 in response to the folded state of the electronic device 101. When receiving the second interrupt signal from the digital Hall sensor 280, the processor 120 may determine that the electronic device 101 is in the unfolded state (or the intermediate state), and may control the operation of the electronic device 101 in response to the unfolded state of the electronic device 101.

When the stored reference values do not exist in operation 1103, the method proceeds to operation 1107 and the processor 120 may perform a reference value setting process. For example, the reference value setting process may include an operation of setting the first reference value BOP based on the magnetic force value H acquired from the digital Hall sensor 280 and a first reference set value (e.g., BOP_delta) and an operation of setting the second reference value BRP based on the set first reference value BOP and a second reference set value BRP_delta at the time point at which the set condition is satisfied. The processor 120 may perform the reference value setting process whenever the state of the electronic device 101 satisfies the set condition.

According to various embodiment of the disclosure, a method of operating a foldable electronic device (e.g., the electronic device 101 in FIG. 1) including a first housing (e.g., the first housing 210 in FIGS. 2A to 2C) and a second housing (e.g., the second housing 220 in FIGS. 2A to 2C) disposed on opposite sides with reference to a folding axis and provided to be folded relative to each other may include: an operation of calculating an angle between the first housing and the second housing based on sensing data measured by a first sensor module (e.g., the first sensor module 270 in FIGS. 2A and 2C) disposed in the first housing and a second sensor module (e.g., the second sensor module 275 in FIGS. 2A and 2C) disposed in the second housing; an operation of acquiring a measured magnetic force value from the digital Hall sensor (e.g., the digital Hall sensor 280 in FIGS. 2A and 2C) of the foldable electronic device when a state of the foldable electronic device corresponding to the calculated angle corresponds to a set condition; and an operation of setting a first reference value associated with folding of the foldable electronic device and a second reference value associated with unfolding of the foldable electronic device based on the magnetic force value.

The setting operation may include: an operation of setting the first reference value based on the magnetic force value obtained from the digital Hall sensor and a first reference set value when the set condition is satisfied; and an operation of setting the second reference value based on the set first reference value and a second reference set value.

The method may further include: an operation of receiving an interrupt signal based on the first reference value or the second reference value from the digital Hall sensor; and an operation of controlling an operation of the foldable electronic device based on the received interrupt signal.

The setting operation may include an operation of setting a difference between the first reference value and the second reference value to be greater than or equal to a reference set value.

The method may further include: an operation of determining that a state of the foldable electronic device corresponds to the set condition when the calculated angle corresponds to a set angle and is maintained at the set angle for a predetermined time.

The controlling operation may include: an operation of determining that the foldable electronic device is in a folded state when a first interrupt signal corresponding to the first reference value is received from the digital Hall sensor, and control an operation of the foldable electronic device in response to the folded state; and an operation of determining that the foldable electronic device is in an unfolded state when a second interrupt signal corresponding to the second reference value is received from the digital Hall sensor, and control the operation of the foldable electronic device in response to the unfolded state.

The setting operation may include: an operation of designating a first reference set value and a second reference set value; an operation of acquiring a plurality of magnetic force values corresponding to a set angle range between the first housing and the second housing from the digital Hall sensor; an operation of calculating a first difference value between two magnetic force values corresponding to a first angle range and a second difference value between two magnetic force values corresponding to a second angle range; an operation of determining the first difference value as the first reference set value when the first difference value exceeds the first reference set value; and an operation of determining the first reference set value as the designated first reference set value when the first difference value is equal to or less than the first reference set value.

The setting operation may include: an operation of determining whether the second difference value exceeds the second reference set value; an operation of determining the second difference value as the second reference set value when the second difference value exceeds the second reference set value; and an operation of determining the second reference set value as the designated second reference set value when the second difference value is equal to or less than the second reference set value.

The method may further include: an operation of determining whether the first reference value or the second reference value is stored in the inactive memory of the foldable electronic device when the foldable electronic device is booted; an operation of controlling an operation of the foldable electronic device based on an interrupt signal corresponding to the stored first reference value and second reference value when the first reference value or the second reference value is stored; and an operation of executing a reference value setting process when the first reference value or the second reference value is not stored.

In the reference value setting process, the magnetic force value measured from the digital Hall sensor may be acquired when the state of the foldable electronic device corresponding to the angle between the first housing and the second housing corresponds to a set condition, and the first reference value and the second reference value may be set based on one or a combination of the magnetic force value, the first reference set value, and the second reference set value.

Various embodiments of the disclosure disclosed in this specification and the drawings are provided merely to represent specific examples for the purpose of easily describing the technical contents of the disclosure and helping the understanding of the disclosure, and are not intended to limit the scope of the disclosure. Accordingly, the scope of the disclosure should be construed in such a manner that, in addition to the embodiments disclosed herein, all changes or modifications derived from the technical idea of the disclosure are included in the scope of the disclosure.

The invention claimed is:

1. A foldable electronic device comprising:
a first housing and a second housing disposed opposite the first housing, the first and second housing configured to fold relative to each other with respect to a folding axis;
a first sensor module coupled to the first housing;
a second sensor module coupled to the second housing;
at least one digital Hall sensor coupled to the first housing or the second housing;
a magnet coupled to the foldable electronic device and configured to interact with the at least one digital Hall sensor;
a memory; and
a processor operatively coupled to one or a combination of the first sensor module, the second sensor module, the digital Hall sensor, and the memory, wherein the processor is configured to:
calculate an angle between the first housing and the second housing based at least in part on sensing data measured by the first sensor module and the second sensor module;
obtain a measured magnetic force value from the digital Hall sensor when a state of the foldable electronic device corresponding to a calculated angle satisfies a set condition; and
set a first reference value associated with folding of the foldable electronic device and a second reference value associated with unfolding of the foldable electronic device based at least in part on the measured magnetic force value.

2. The foldable electronic device of claim 1, wherein the processor is configured to:

set the first reference value based at least in part on the measured magnetic force value obtained from the digital Hall sensor at a time when the set condition is satisfied and a first reference set value; and set the second reference value based at least in part on the set first reference value and a second reference set value.

3. The foldable electronic device of claim 1, wherein the processor is configured to:

receive an interrupt signal based at least in part on the first reference value or the second reference value from the digital Hall sensor; and control an operation of the foldable electronic device based at least in part on the received interrupt signal.

4. The foldable electronic device of claim 1, wherein the processor is configured to:

set a difference between the first reference value and the second reference value to be greater than or equal to a reference set value.

5. The foldable electronic device of claim 1, wherein the processor is configured to:

determine that a state of the foldable electronic device corresponds to the set condition when the calculated angle corresponds to a set angle and is maintained at the set angle for a predetermined time.

6. The foldable electronic device of claim 1, wherein the processor is configured to:

determine that the foldable electronic device is in a folded state when a first interrupt signal corresponding to the first reference value is received from the digital Hall sensor, and control an operation of the foldable electronic device in response to the folded state; and determine that the foldable electronic device is in an unfolded state when a second interrupt signal corresponding to the second reference value is received from the digital Hall sensor, and control the operation of the foldable electronic device in response to the unfolded state.

7. The foldable electronic device of claim 1, wherein the processor is configured to:

designate a first reference set value and a second reference set value;

acquire a plurality of magnetic force values corresponding to a set angle range between the first housing and the second housing from the digital Hall sensor;

calculate a first difference value between two magnetic force values corresponding to a first angle range and a second difference value between two magnetic force values corresponding to a second angle range;

determine the first difference value as the first reference set value when the first difference value exceeds the first reference set value; and determine the first reference set value as the designated first reference set value when the first difference value is equal to or less than the first reference set value.

8. The foldable electronic device of claim 7, wherein the processor is configured to:

determine whether the second difference value exceeds the second reference set value;

determine the second difference value as the second reference set value when the second difference value exceeds the second reference set value; and determine the second reference set value as the designated second reference set value when the second difference value is equal to or less than the second reference set value.

9. The foldable electronic device of claim 1, wherein the processor is configured to store the set first reference value or the second reference value in an inactive memory included in the memory.

10. The foldable electronic device of claim 9, wherein the processor is configured to:

determine whether the first reference value or the second reference value is stored in the inactive memory when the foldable electronic device is booted;

control an operation of the foldable electronic device based at least in part on an interrupt signal corresponding to the stored first reference value and second reference value when the first reference value or the second reference value is stored; and execute a reference value setting process when the first reference value or the second reference value is not stored.

11. The foldable electronic device of claim 10, wherein, in the reference value setting process, the measured magnetic force value from the digital Hall sensor is acquired when the state of the foldable electronic device corresponding to the angle between the first housing and the second housing corresponds to the set condition, and the first reference value and the second reference value are set based on one or a combination of the magnetic force value, a first reference set value, and a second reference set value.

12. A method of operating a foldable electronic device including a first housing and a second housing disposed opposite the first housing, the first and second housings configured to fold relative to each other with respect to a folding axis, the method comprising:

an operation of calculating an angle between the first housing and the second housing based on sensing data measured by a first sensor module coupled to the first housing and a second sensor module coupled to the second housing;

an operation of acquiring a measured magnetic force value from the digital Hall sensor of the foldable electronic device when a state of the foldable electronic device corresponding to the calculated angle corresponds to a set condition; and an operation of setting a first reference value associated with folding of the foldable electronic device and a second reference value associated with unfolding of the foldable electronic device based at least in part on the measured magnetic force value.

13. The method of claim 12, wherein the setting operation includes:

an operation of setting the first reference value based at least in part on the magnetic force value obtained from the digital Hall sensor and a first reference set value when the set condition is satisfied; and an operation of setting the second reference value based at least in part on the set first reference value and a second reference set value.

14. The method of claim 12, further comprising:

an operation of receiving an interrupt signal based at least in part on the first reference value or the second reference value from the digital Hall sensor; and an operation of controlling an operation of the foldable electronic device based at least in part on the received interrupt signal.

15. The method of claim 12, wherein the setting operation includes:

an operation of setting a difference between the first reference value and the second reference value to be greater than or equal to a reference set value.

16. The method of claim 12, further comprising:
an operation of determining that a state of the foldable electronic device corresponds to the set condition when the calculated angle corresponds to a set angle and is maintained at the set angle for a predetermined time.

17. The method of claim 12, wherein the controlling operation includes:
an operation of determining that the foldable electronic device is in a folded state when a first interrupt signal corresponding to the first reference value is received from the digital Hall sensor, and control an operation of the foldable electronic device in response to the folded state; and
an operation of determining that the foldable electronic device is in an unfolded state when a second interrupt signal corresponding to the second reference value is received from the digital Hall sensor, and control the operation of the foldable electronic device in response to the unfolded state.

18. The method of claim 12, wherein the setting operation includes:
an operation of designating a first reference set value and a second reference set value;
an operation of acquiring a plurality of magnetic force values corresponding to a set angle range between the first housing and the second housing from the digital Hall sensor;
an operation of calculating a first difference value between two magnetic force values corresponding to a first angle range and a second difference value between two magnetic force values corresponding to a second angle range;
an operation of determining the first difference value as the first reference set value when the first difference value exceeds the first reference set value; and
an operation of determining the first reference set value as the designated first reference set value when the first difference value is equal to or less than the first reference set value.

19. The method of claim 18, wherein the setting operation includes:
an operation of determining whether the second difference value exceeds the second reference set value;
an operation of determining the second difference value as the second reference set value when the second difference value exceeds the second reference set value; and
an operation of determining the second reference set value as the designated second reference set value when the second difference value is equal to or less than the second reference set value.

20. The method of claim 12, further comprising:
an operation of determining whether the first reference value or the second reference value is stored in the inactive memory of the foldable electronic device when the foldable electronic device is booted;
an operation of controlling an operation of the foldable electronic device based on an interrupt signal corresponding to the stored first reference value and second reference value when the first reference value or the second reference value is stored; and
an operation of executing a reference value setting process when the first reference value or the second reference value is not stored,
wherein, in the reference value setting process,
the magnetic force value measured from the digital Hall sensor is acquired when the state of the foldable electronic device corresponding to the angle between the first housing and the second housing corresponds to a set condition, and the first reference value and the second reference value are set based on one or a combination of the magnetic force value, the first reference set value, and the second reference set value.

* * * * *